(12) United States Patent
Shimayama

(10) Patent No.: US 11,462,600 B2
(45) Date of Patent: Oct. 4, 2022

(54) DISPLAY DEVICE AND MANUFACTURING METHOD OF DISPLAY DEVICE, AND ELECTRONIC DEVICE

(71) Applicant: Sony Semiconductor Solutions Corporation, Kanagawa (JP)

(72) Inventor: Tsutomu Shimayama, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 118 days.

(21) Appl. No.: 17/051,655

(22) PCT Filed: Apr. 23, 2019

(86) PCT No.: PCT/JP2019/017175
§ 371 (c)(1),
(2) Date: Oct. 29, 2020

(87) PCT Pub. No.: WO2019/216196
PCT Pub. Date: Nov. 14, 2019

(65) Prior Publication Data
US 2021/0057499 A1 Feb. 25, 2021

(30) Foreign Application Priority Data
May 8, 2018 (JP) .............................. JP2018-089671

(51) Int. Cl.
*H01L 27/32* (2006.01)
*H01L 51/00* (2006.01)
(Continued)

(52) U.S. Cl.
CPC ...... *H01L 27/3246* (2013.01); *H01L 27/3213* (2013.01); *H01L 51/001* (2013.01);
(Continued)

(58) Field of Classification Search
CPC ............. H01L 27/3246; H01L 27/3213; H01L 51/001; H01L 51/5218; H01L 51/5234;
(Continued)

(56) References Cited

U.S. PATENT DOCUMENTS

2014/0175469 A1* 6/2014 Dozen ................. H01L 27/3246
257/89
2015/0008407 A1* 1/2015 Sato .................... H01L 51/5271
257/40
(Continued)

FOREIGN PATENT DOCUMENTS

JP 2012-129041 A 7/2012
JP 2014102976 A * 6/2014 ............. H01L 51/50

OTHER PUBLICATIONS

English Machine Translation of JP 2014102976A (Year: 2014).*

*Primary Examiner* — Dzung Tran
(74) *Attorney, Agent, or Firm* — Michael Best & Friedrich LLP

(57) ABSTRACT

A display device of the present disclosure includes a plurality of recess portions provided on a pixel formation surface, and a pixel arranged in each of the plurality of recess portions, in which a light-emitting unit of the pixel is formed on a side wall and a bottom surface of each of the plurality of recess portions. A manufacturing method of a display device of the present disclosure is a manufacturing method of a display device having the above-described configuration. Furthermore, an electronic device of the present disclosure is an electronic device including a display device having the above-described configuration.

16 Claims, 18 Drawing Sheets

(51) Int. Cl.
    *H01L 51/52*      (2006.01)
    *H01L 51/56*      (2006.01)
    *G09G 3/3233*     (2016.01)

(52) U.S. Cl.
    CPC ...... *H01L 51/5218* (2013.01); *H01L 51/5234* (2013.01); *H01L 51/56* (2013.01); *G09G 3/3233* (2013.01); *G09G 2300/0452* (2013.01); *G09G 2310/0202* (2013.01); *G09G 2310/0286* (2013.01); *H01L 2227/323* (2013.01); *H01L 2251/5315* (2013.01)

(58) Field of Classification Search
    CPC ............... H01L 51/56; H01L 2227/323; H01L 2251/5315
    USPC ......................................................... 257/40
    See application file for complete search history.

(56) References Cited

U.S. PATENT DOCUMENTS

| | | | |
|---|---|---|---|
| 2016/0164017 A1* | 6/2016 | Suzuki | H01L 51/0072 257/40 |
| 2016/0233456 A1* | 8/2016 | Higashika | H01L 51/5231 |
| 2018/0026215 A1* | 1/2018 | Zhou | H01L 51/009 257/40 |

* cited by examiner (PROCESS 1)

(PROCESS 2)

(PROCESS 3)

(PROCESS 4)

(PROCESS 5)

(PROCESS 6)

(PROCESS 7)

(PROCESS 8)

(PROCESS 9)

(PROCESS 10)

(PROCESS 11)

(PROCESS 12)

(PROCESS 13)

(PROCESS 14)

(PROCESS 15)

(PROCESS 1) TO (PROCESS 13) — SAME PROCESSING AS (PROCESS 1) TO (PROCESS 13) OF THIRD EMBODIMENT EXCEPT THAT 83w IS REPLACED WITH 83b (PROCESS 14)

(PROCESS 15)

(PROCESS 16)

(PROCESS 17)

(PROCESS 18)

DISPLAY DEVICE AND MANUFACTURING METHOD OF DISPLAY DEVICE, AND ELECTRONIC DEVICE

TECHNICAL FIELD

The present disclosure relates to a display device and a manufacturing method of a display device, and an electronic device.

BACKGROUND ART

As a recent display device, a flat-panel type display device has prevailed. As one of flat-panel type display devices, there is a display device that uses, as a light-emitting unit (light-emitting element) of a pixel, a so-called current drive-type electrooptic element of which light emission luminance changes in accordance with a value of current flowing in the device. As the current drive-type electrooptic element, an organic EL element that uses electro luminescence (EL) of organic material and uses a phenomenon in which light is emitted by applying an electric field to an organic thin film has been known.

An organic EL element is formed by performing evaporation film formation using organic EL material on an anode electrode. Furthermore, as one of methods of implementing color display, there is a color coding method of individually patterning elements of respective colors of red (R), green (G), and blue (B). In the case of this color coding method, it is necessary to mask an electrode opening portion of another color for each color of RGB and evaporate organic EL material. Thus, the positioning accuracy of the mask restricts a pixel pitch. From the aspect of the accuracy of the mask, it is difficult to achieve higher definition and this tendency becomes prominent as the pixel pitch becomes smaller.

Meanwhile, in the conventional pixel array, elements of the respective colors of RGB are generally formed on a flat surface parallel to a substrate surface of a backplane substrate. In contrast to this, there has been proposed a light emission device in which a plurality of polyhedral structures is formed on a substrate, a light-emitting element is formed on an inclined surface of the polyhedral structure, and pixels are arrayed in stripe (for example, refer to Patent Document 1).

CITATION LIST

Patent Document

Patent Document 1: Japanese Patent Application. Laid-Open No. 2012-129041

SUMMARY OF THE INVENTION

Problems to be Solved by the Invention

In the prior art described in Patent Document 1 described above, the polyhedral structure having an inclined surface on which a light-emitting element is formed is a protruding portion formed in a state of protruding on the substrate. In the case of the prior art in which a light-emitting element is formed on an inclined surface of the polyhedral structure being a protruding portion on the substrate, light is emitted from a light-emitting element of each color in a direction getting away from the center of the pixel, that is to say, in a diffusing direction. Thus, a decline in light takeout efficiency and view angle dependency occur.

The present disclosure aims to provide a display device that enables higher definition using a color coding method, and can enhance light takeout efficiency, and a manufacturing method of the display device, and an electronic device including the display device.

Solutions to Problems

A display device of the present disclosure for achieving the above-described purpose includes a plurality of recess portions provided on a pixel formation surface, and a pixel arranged in each of the plurality of recess portions, in which a light-emitting unit of the pixel is formed on a side wall and a bottom surface of each of the plurality of recess portions.

Furthermore, a manufacturing method of a display device for achieving the above-described purpose includes, in manufacturing the display device including a plurality of recess portions provided on a pixel formation surface, and a pixel arranged in each of the plurality of recess portions, forming a light-emitting unit of the pixel on a side wall and a bottom surface of each of the plurality of recess portions.

Furthermore, an electronic device of the present disclosure for achieving the above-described purpose includes a display device having the above-described configuration.

BRIEF DESCRIPTION OF DRAWINGS

FIG. 14 is a plan view illustrating a pixel structure according to a fifth embodiment.

MODE FOR CARRYING OUT THE INVENTION

Figure 1:
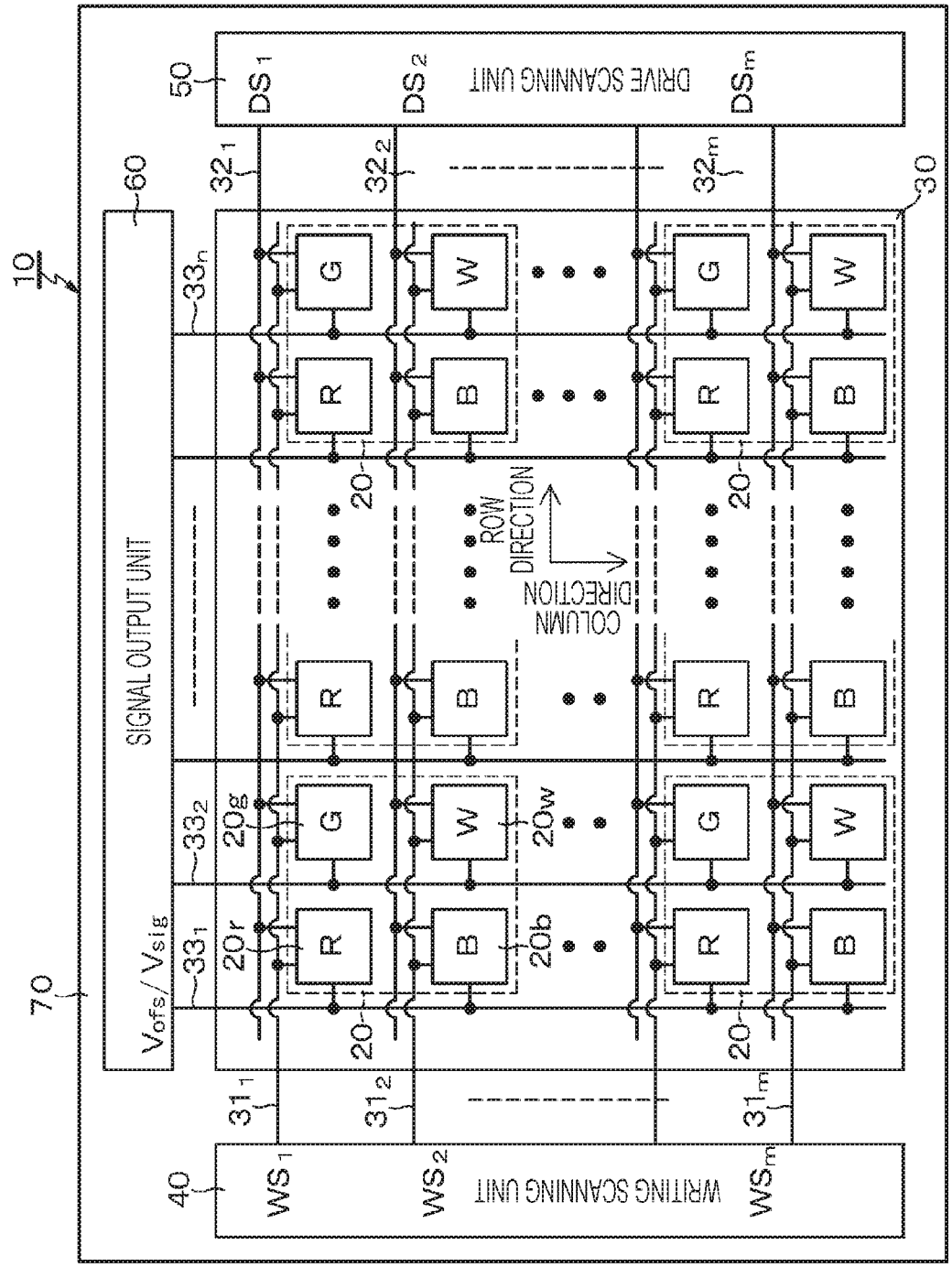
FIG. 1 is a system configuration diagram schematically illustrating a configuration of an organic EL display device to which the technology of the present disclosure is applied.

Hereinafter, a mode for carrying out the technology of the present disclosure (hereinafter, will be described as an "embodiment") will be described using the drawings. The technology of the present disclosure is not limited to an embodiment, and various numerical values, materials, and the like in the embodiment are exemplifications. In the following description, the same components or components having the same function are assigned the same reference numerals, and the redundant description will be omitted. Note that the description will be given in the following order.
1. Display Device of Present Disclosure and Manufacturing Method of The Same, and Electronic Device, and Overall Description
2. Display Device to Which Technology of Present Disclosure Is Applied
   2-1. System Configuration
   2-2. Pixel Circuit
   2-3. Color Coding Method
3. Embodiment of Present Disclosure
   3-1. First Embodiment (Example in Which Pixel includes Subpixels of Four Colors of RGBW)
   3-2. Second Embodiment (Modified Example of First Embodiment: Another Example of Shape of Recess Portion)
   3-3. Third Embodiment (Example of Manufacturing Method of Pixel Structure According to First Embodiment)
   3-4. Fourth Embodiment (Example in which Pixel Includes Subpixels of Three Colors of RGB)
   3-5. Fifth Embodiment (Modified Example of Fourth Embodiment: Another Example of Shape of Side Anode Electrode)
   3-6. Sixth Embodiment (Example of Manufacturing Method of Pixel Structure According to Fourth Embodiment)
4. Modified Example
5. Electronic Device of Present Disclosure
   5-1. Specific Example 1 (Example of Digital Still Camera)
   5-2. Specific Example 2 (Example of Head-Mounted Display)
6. Configuration That Can Be Employed in Present Disclosure Display Device of Present Disclosure and Manufacturing Method of The Same, and Electronic Device, and Overall Description In the display device of the present disclosure and a manufacturing method of the same, and an electronic device, a pixel has a configuration including a plurality of light-emitting units with light emission colors different from each other. Then, one of the plurality of light-emitting units is formed on the bottom surface of each of a plurality of recess portions.

In the display device of the present disclosure and a manufacturing method of the same, and the electronic device that include the above-described preferable configuration, light emission colors of a plurality of light-emitting units include four colors of red, green, blue, and white, red, green, and blue light-emitting units are formed on side walls of each of a plurality of recess portions, and a white light-emitting unit is formed on the bottom surface of each of the plurality of recess portions.

Moreover, in the display device of the present disclosure and a manufacturing method of the same, and the electronic device that include the above-described preferable configuration, a light emission layer of a light-emitting unit formed on the side wall of the recess portion can be formed by oblique evaporation of light emission material with respect to the side wall of the recess portion. Then, in the oblique evaporation, an incident angle of light emission material with respect to the bottom surface of the recess portion is preferably set to an angle at which the light emission layer is formed on the side wall and the bottom surface of the recess portion. Furthermore, an incident angle of the light emission material can be set on the basis of a size of the side anode electrode formed on the side wall of the recess portion, and a size of a bottom anode electrode formed on the bottom surface of the recess portion.

Alternatively, in the display device of the present disclosure and a manufacturing method of the same, and the electronic device that include the above-described preferable configuration, light emission colors of a plurality of light-emitting units include two colors of red, green, and blue, light-emitting units of two colors among three colors are formed on side walls of each of a plurality of recess portions, and a light-emitting unit of a remaining one color is formed on the bottom surface of each of the plurality of recess portions.

Moreover, in the display device of the present disclosure and a manufacturing method of the same, and the electronic device that include the above-described preferable configuration, a light emission layer of a light-emitting unit formed on the side wall of the recess portion can be formed by oblique evaporation of light emission material with respect to the side wall of the recess portion. Then, in the oblique evaporation, an incident angle of light emission material with respect to the bottom surface of the recess portion is preferably set to an angle at which the light emission layer is not formed on the bottom surface of the recess portion.

Moreover, in the display device of the present disclosure and a manufacturing method of the same, and the electronic device that include the above-described preferable configuration, a light-emitting unit of a pixel can have a configuration of including an organic electroluminescence element.

Display Device to which Technology of Present Disclosure is Applied

A display device to which the technology of the present disclosure is applied is an active matrix type display device that controls current flowing in an electrooptic element, using an active element provided in the same pixel circuit as the electrooptic element, such as an insulated gate field effect transistor, for example. As an insulated gate field effect transistor, typically, a metal oxide semiconductor (MOS) transistor and a thin film transistor (TIT) can be exemplified.

Here, as an example, the description will be given using an example of an active matrix type organic EL display device that uses a current drive type electrooptic element such as an organic EL element, for example, that changes in light emission luminance in accordance with a value of current flowing in a device, as a light-emitting unit (light emitting element) of a pixel circuit.

System Configuration

FIG. 1 is a system configuration diagram schematically illustrating a configuration of an organic EL display device to which the technology of the present disclosure is applied. As illustrated in FIG. 1, an organic EL display device 10 according to this application example has a configuration including a pixel allay portion 30 including a plurality of pixels 20 including an organic EL element that is two-dimensionally arrayed in a matrix shape, and a peripheral circuit portion that drives each pixel 20 of the pixel allay portion 30.

The organic EL display device 10 according to this application example is a display device that supports color display. Then, the pixel 20 is a main pixel serving as a unit for forming a color image, and each includes a plurality of subpixels having light emission colors different from each other. As an example, the pixel 20 includes four subpixels including a subpixel 20r that emits red (R) light, a subpixel 20g that emits green (G) light, a subpixel 20b that emits blue (13) light, and a subpixel 20w that emits white (W) light.

The subpixels 20r, 20g, 20b, and 20w are arranged in a grid, for example. In the grid arrangement, the array of the subpixels 20r, 20g, 20b, and 20w is not limited to a color array illustrated in FIG. 1.
Hereinafter, the subpixels 20r, 20g, 20b, and 20w will be sometimes collectively referred to as a subpixel 20s.

The peripheral circuit portion includes, for example, a writing scanning unit 40 mounted on the same display panel 70 as the pixel allay portion 30, a drive scanning unit. 50, a signal output unit 60, and the like, and drives each of the subpixels 20s of the pixel allay portion 30. Note that a configuration in which a part or all of the writing scanning unit 40, the drive scanning unit 50, and the signal output unit 60 are provided on the outside of the display panel 70 can be employed.

As a substrate of the display panel 70, an insulative transparent substrate such as a glass substrate can be used, or a semiconductor substrate such as a silicon substrate can also be used. An organic EL display device that uses a semiconductor substrate such as a silicon substrate, as a substrate of the display panel 70 is referred to as a so-called micro display (compact display), and is preferably used as an electronic viewfinder of a digital still camera, a display unit of a head-mounted display, or the like.

In the pixel allay portion 30, for an array of the subpixel 20s in m rows and n columns, scanning lines 31 ($31_1$ to $31_m$) and drive lines 32 ($32_1$ to $32_m$) are laid for each pixel row along a row direction (array direction of pixels in a pixel row/horizontal direction). Moreover, for the array of subpixels 20s in m rows and n columns, signal lines 33 ($33_1$ to $33_n$) are laid for each pixel column along a column direction (array direction of pixels in a pixel column/vertical direction).

The scanning line $31_1$ to $31_m$ are respectively connected to output ends of corresponding rows of the writing scanning unit 40. The drive line $32_1$ to $32_m$ are respectively connected to output ends of corresponding rows of a drive scanning unit 50. The signal line $33_1$ to $33_n$ are respectively connected to output ends of corresponding columns of the signal output unit 60.

The writing scanning unit 40 includes a shift register circuit, an address decoder, and the like. The writing scanning unit 40 performs so-called linear sequential scanning of sequentially scanning the subpixels 20s of the pixel allay portion 30 for each row by sequentially supplying writing scanning signals WS ($WS_1$ to $WS_m$) to the scanning lines 31 ($31_1$ to $31_m$) in writing a signal voltage of a video signal into each of the subpixels 20s of the pixel allay portion 30.

Similarly to the writing scanning unit 40, the drive scanning unit 50 includes a shift register circuit, an address decoder, and the like. The drive scanning unit 50 performs control of light emission/light non-emission (extinction) of the subpixels 20s by supplying light emission control signals DS ($DS_1$ to $DS_m$) to the drive lines 32 ($32_1$ to $32_m$) in synchronization with linear sequential scanning performed by the writing scanning unit 40.

The signal output unit 60 selectively outputs a signal voltage of a video signal (hereinafter, will be sometimes simply described as a "signal voltage") $V_{sig}$ that corresponds to luminance information supplied from a signal supply source (not illustrated), and a reference voltage $V_{ofs}$. Here, the reference voltage $V_{ofs}$ is a voltage corresponding to a voltage on which the signal voltage $V_{sig}$ of the video signal is based. (for example, voltage corresponding to a black level of the video signal), or a voltage in the vicinity thereof. The reference voltage $V_{ofs}$ is used as an initialization voltage in performing a correction operation.

The signal voltage $V_{sig}$/reference voltage $V_{ofs}$ selectively output from the signal output unit 60 is written into the subpixels 20s of the pixel allay portion 30 via the signal lines 34 ($34_1$ to $34_n$) for each pixel row selected by linear sequential scanning performed by the writing scanning unit 40. In other words, the signal output unit 60 employs a drive configuration of linear sequential writing of writing the signal voltage $V_{sig}$ for each pixel row (line).

Pixel Circuit

Figure 2:
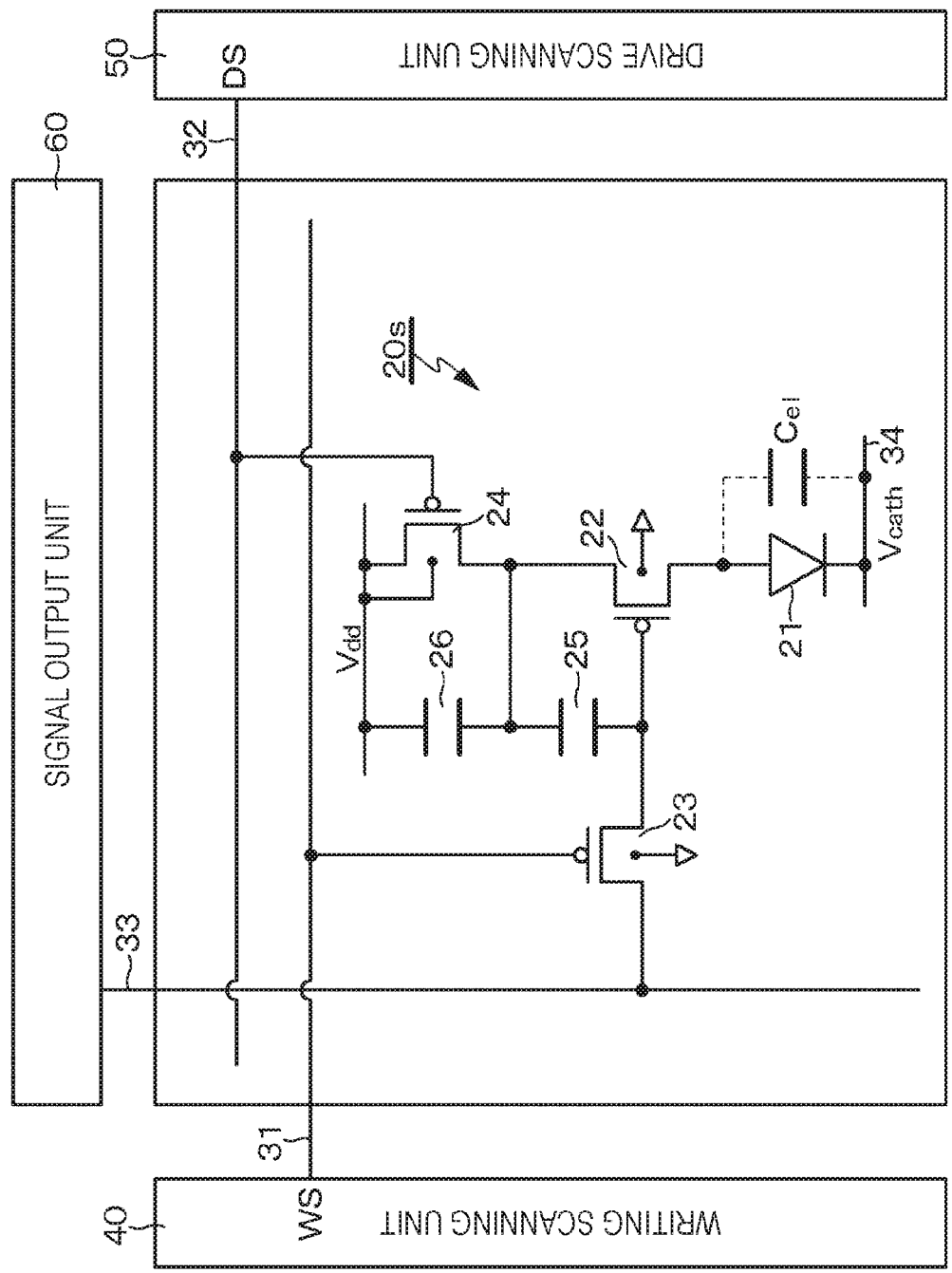
FIG. 2 is a circuit diagram illustrating an example of a circuit configuration of a pixel (pixel circuit) in the organic EL display device to which the technology of the present disclosure is applied.

FIG. 2 is a circuit diagram illustrating an example of a circuit configuration of a pixel (pixel circuit) in the organic EL display device 10 to which the technology of the present disclosure is applied. A light-emitting unit of the subpixel 20s includes an organic EL element 21. The organic EL element 21 is an example of a current drive type electrooptic element having light emission luminance changing in accordance with a value of current flowing in the device.

As illustrated in FIG. 2, the subpixel 20s includes the organic EL element 21, and a drive circuit (pixel drive circuit) that drives the organic EL element 21 by flowing current in the organic EL element 21. A cathode electrode of the organic EL element 21 is connected to a common power source line 34 laid in common to all the subpixels 20s. In the drawing, $C_{el}$ denotes equivalent capacitance of the organic EL element 21.

A drive circuit unit that drives the organic EL element 21 has a configuration including a drive transistor 22, a sampling transistor 23, a light emission control transistor 24, a holding capacitance 25, and an auxiliary capacitance 26. Here, it is assumed that the organic EL element 21 and the drive circuit thereof are not formed on an insulating material such as a glass substrate but on a semiconductor substrate such as a silicon substrate, and the drive transistor 22 employs a configuration of using a P-channel type transistor.

Furthermore, in this example, the sampling transistor 23 and the light emission control transistor 24 also employ a configuration of using a P-channel type transistor similarly to the drive transistor 22. Accordingly, the drive transistor the sampling transistor 23, and the light emission control transistor 24 have a four-terminal configuration including source/gate/drain/back gate instead of a three-terminal configuration including source/gate/drain. A source voltage $V_{dd}$ is applied to a back gate.

Nevertheless, because the sampling transistor 23 and the light emission control transistor 24 are switching transistors functioning as switch elements, the sampling transistor 23 and the light emission control transistor 24 are not limited to P-channel type transistors. Accordingly, the sampling transistor 23 and the light emission control transistor 24 may be N-channel type transistors or may have a configuration in which P-channel type transistors and N-channel type transistors mixedly exist.

In the subpixel 20s having the above-described configuration, the sampling transistor 23 performs writing into the holding capacitance 25 by sampling the signal voltage $V_{sig}$ of the video signal supplied from the signal output unit 60 through the signal line 33. The light emission control transistor 24 is connected between a node of the source voltage $V_{dd}$ and a source electrode of the drive transistor 22, and controls light emission/light non-emission of the organic EL element 21 under the driving performed in accordance with the light emission control signal DS.

The holding capacitance 25 is connected between a gate electrode and a source electrode of the drive transistor 22. The holding capacitance 25 holds the signal voltage $V_{sig}$ of the video signal written into by the sampling performed by the sampling transistor 23. The drive transistor 22 drives the organic EL element 21 by flowing drive current corresponding a voltage held by the holding capacitance 25, in the organic EL element 21.

The auxiliary capacitance 26 is connected between the source electrode of the drive transistor 22 and a node with a fixed potential such as, for example, the node of the source voltage $V_{dd}$. The auxiliary capacitance 26 has a function of suppressing a variation in source potential of the drive transistor 22 when the signal voltage $V_{sig}$ of the video signal is written into, and has a function of setting a gate-source voltage $V_{gs}$ of the drive transistor 22 to a threshold voltage $V_{th}$ of the drive transistor 22.

Color Coding Method

In the organic EL display device 10 having the above-described configuration, the organic EL element 21 is formed by performing evaporation film formation using organic EL material being light emission material on an anode electrode using a color coding method, which is one of coloring methods. Because the color coding method coats the subpixels 20s (20r, 20g, 20b, and 20w) with different colors, and causes the organic EL element 21 of each color to emit light, the color coding method has a larger advantages from the aspect of light emission efficiency and light takeout efficiency as compared with a method of using a color filter.

Nevertheless, in the case of the color coding method, because it is necessary to mask an electrode opening portion of another color for each color of the subpixels 20s, and evaporate organic EL material, the positioning accuracy of the mask restricts a pixel pitch. Thus, from the aspect of the accuracy of the mask, it is difficult to achieve higher definition and this tendency becomes prominent as the pixel pitch becomes smaller.

Embodiment of Present Disclosure

In view of the foregoing, in an embodiment of the present disclosure, for enabling higher definition using the color coding method, a so-called stereoscopic arrangement structure of the pixel 20 in which a plurality of recess portions is provided on a pixel formation surface, and the pixel 20 is arranged in each of the plurality of recess portions is employed. At this time, the organic EL element 21 being a light-emitting unit of the pixel 20 is formed for each of the subpixels 20s (20r, 20g, 20b, 20w) using the side wall and the bottom surface (bottom portion) of each of the plurality of recess portions. Here, the light emission colors of the organic EL element 21 are four colors of RGBW, but the light emission colors are not limited to these. For example, the light emission colors may be three colors of RGB, or all colors can be set to white for the purpose of achieving higher luminance.

Hereinafter, a specific embodiment of the present embodiment for enabling higher definition using the color coding method will be described.

First Embodiment

Figure 3A:
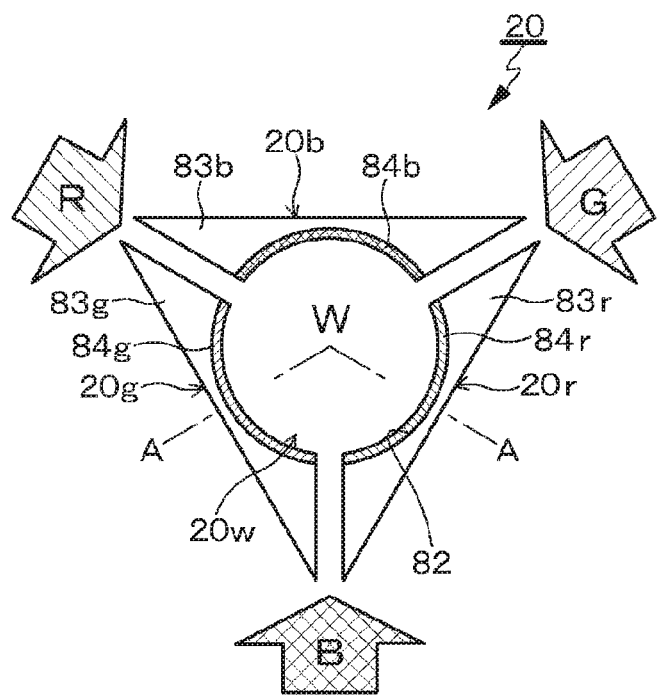
FIG. 3A is a plan view illustrating a pixel structure according to the first embodiment.
Figure 3B:
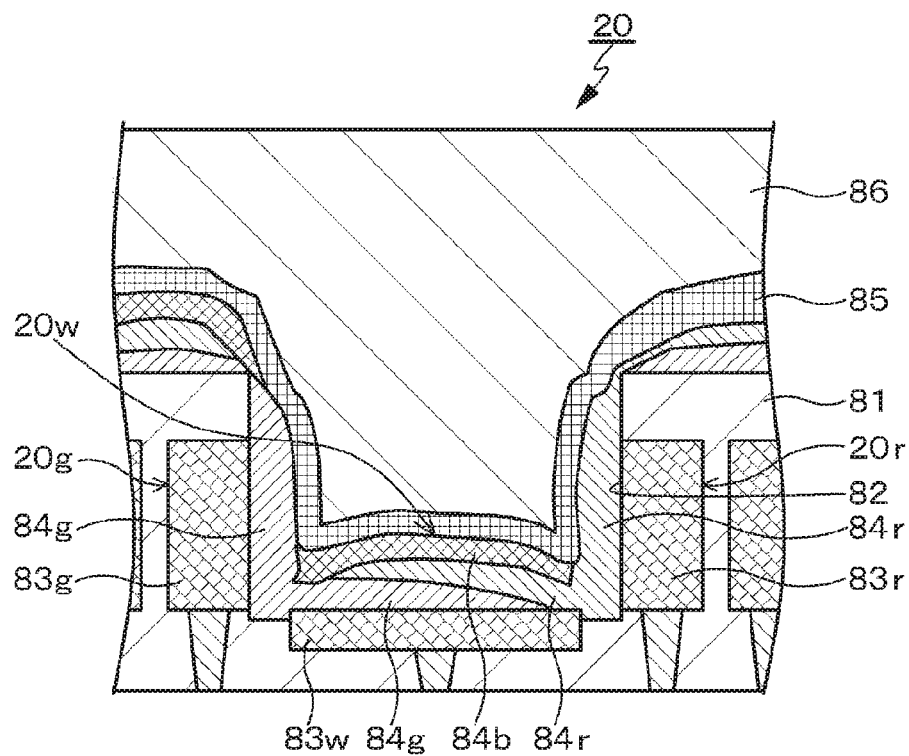
FIG. 3B is a cross-sectional view illustrating a cross-sectional structure taken along an A-A line in FIG. 3A.

The first embodiment is an example in which the pixel 20 includes the subpixels 20r, 20g, 20b, and 20w of four colors of RGBW. FIG. 3A illustrates a plan view of a pixel structure according to the first embodiment, and FIG. 3B illustrates a cross-sectional view taken along an A-A line in FIG. 3A. Here, it is assumed that the organic EL element 21 and the drive circuit thereof are formed on a semiconductor substrate such as a silicon substrate.

Generally, a circuit layer on which the drive circuit is formed is stacked on the semiconductor substrate, an interlayer insulating film 81 illustrated in FIG. 3B is formed on the circuit layer, and the pixel 20 is formed on the interlayer insulating film 81. In other words, the top surface of the interlayer insulating film 81 becomes a pixel formation surface, and the pixel 20 is formed on the pixel formation surface.

The pixel structure according to the first embodiment has a configuration in which a plurality of recess portions 82 corresponding to the number of pixels 20 is provided on the top surface of the interlayer insulating film 81, which is a pixel formation surface, and the pixel 20 including the subpixels 20r, 20g, 20b, and 20w of four colors of RGBW is arranged in each of the plurality of recess portions 82. In other words, the pixel structure according to the first embodiment has a stereoscopic arrangement structure in which the pixel 20 including the subpixels 20r, 20g, 20b, and 20w of four colors of RGBW is arranged in each of the plurality of recess portions 82.

In a planar view, the plurality of recess portions 82 has a substantially circular shape, for example, and has a configuration divided into three in a circumferential direction. In the present embodiment, the side wall (side surface) of the recess portion 82 is a vertical surface vertical to the pixel formation surface. Here, the "vertical surface" includes a case of a substantially vertical surface in addition to a case of a strictly vertical surface, and the existence of various variations generated in design or manufacturing is allowed. Nevertheless, the side wall needs not be always a vertical surface, and may be an inclined surface inclining in a direction in which an opening of the recess portion 82 widens.

In the pixel structure according to the first embodiment, the use of the side wall and the bottom surface (bottom portion) of the recess portion 82 enables the pixel 20 including the subpixels 20r, 20g, 20b, and 20w of RGBW to be arranged in one recess portion 82. Specifically, the respective organic EL elements 21 of the subpixels 20r, 20g, and 20b of RGB are formed on the three-divided side walls of the recess portion 82, and the organic EL element 21 of the subpixel 20w of W is formed on the bottom surface of the recess portion 62.

FIG. 3B illustrates cross-sectional structures of the subpixel 20g of G, the subpixel 20r of R, and the subpixel 20w of W. Respective anode electrodes 83g and 63r of the subpixels 20g and 20r are buried in the side wall of the recess portion 82 as side anode electrodes, and an anode electrode 83w of the subpixel 20w is buried in the bottom surface of the recess portion 82 as a bottom anode electrode. As material of an anode electrode, for example, metal material such as aluminum (Al) or a stacked layer of indium tin oxide (ITO) and silver (Ag) can be used.

Then, in the pixel structure according to the first embodiment, a film is formed using organic EL material being light emission material on a side anode electrode by oblique evaporation. Arrows illustrated in FIG. 3A respectively indicate film formation directions of RGB by oblique evaporation. In the case of the present embodiment, for example, film formation of each color is performed using organic EL material in the order of G, R, and B.

First of all, a film of an organic EL layer 84g of G is formed on an anode electrode 83g of G by oblique evaporation. Therefore, the subpixel 20g of G is formed. At, this time, in the oblique evaporation, by setting an incident angle of organic EL material being light emission material to an optimum angle, the film of the organic EL layer 84g of G can be formed also on the anode electrode 83w of W on the bottom surface of the recess portion 82. The details of the incident angle of the organic EL material will be described later.

Next, a film of an organic EL layer 84r of R is formed on an anode electrode 83r of R by oblique evaporation. Therefore, the subpixel 20r of R is formed. At this time, by the oblique evaporation, the film of the organic EL layer 84r of R is formed on the organic EL layer 84g of G formed on the bottom surface of the recess portion 82.

Lastly, a film of an organic EL layer 84b of B is formed on an anode electrode 83b of B by oblique evaporation. Therefore, the subpixel 20b of B is formed. At this time, by the oblique evaporation, the film of the organic EL layer 84b of 3 is formed on the organic EL layer 84r of R formed on the bottom surface of the recess portion 82.

Furthermore, by the above-described three-times oblique evaporation of GRB, on the anode electrode 83w of W on the bottom surface of the recess portion 82, the organic EL layer 84g of G, the organic EL layer 84r of R, and the organic EL layer 84b of B are stacked. As a result, on the bottom surface of the recess portion 82, the subpixel 20w of W including the stacked layer of the organic EL layer 84g of G, the organic EL layer 84r of R, and the organic EL layer 84b of B is formed.

Then, a cathode electrode 85 including a transparent electrode is formed on the organic EL layer 84g of G, the organic EL layer 84r of R, and the organic EL layer 84b of B as a common electrode among all the pixels 20. As a material of the cathode electrode 85, for example, a material such as ITO, indium zinc oxide (IZO), or zinc oxide (ZnO) can be used. A protection film 86 is formed on the cathode electrode 85.

As described above, the pixel structure according to the first embodiment is a pixel structure in which the pixel 20 including the subpixels 20r, 20g, 20b, and 20w of RGBW is sterically arranged in each of the plurality of recess portions 82 formed on the pixel formation surface. In the pixel structure, the size of the bottom surface of the recess portion 82 on which the subpixel 20w of W is formed corresponds to the size of one subpixel in a case where the subpixels 20r, 20g, 20b, and 20w of RGBW are planarly arranged.

In other words, according to the pixel structure according to the first embodiment, by the stereoscopic arrangement of the pixel 20 that uses the side wall and the bottom surface (bottom portion) of the recess portion 82, because the pixel 20 including the subpixels 20r, 20g, 20b, and 20w of RGBW can be arranged in the size of the subpixel, higher definition can be achieved even using the color coding method.

Figure 4A:
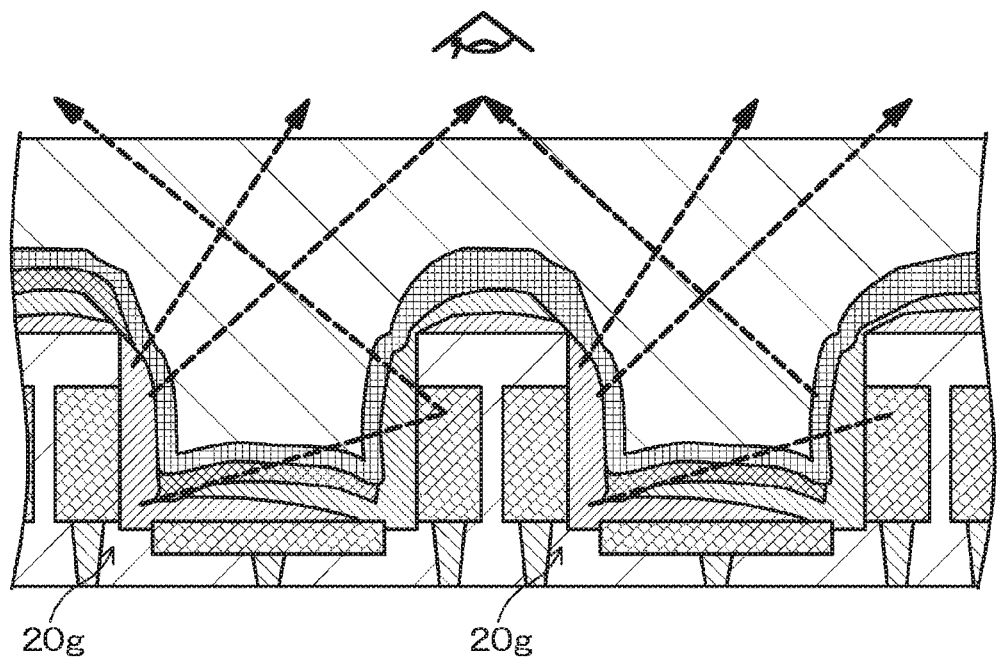
FIG. 4A is a schematic diagram illustrating a state of light emission of a subpixel of G.
Figure 4B:
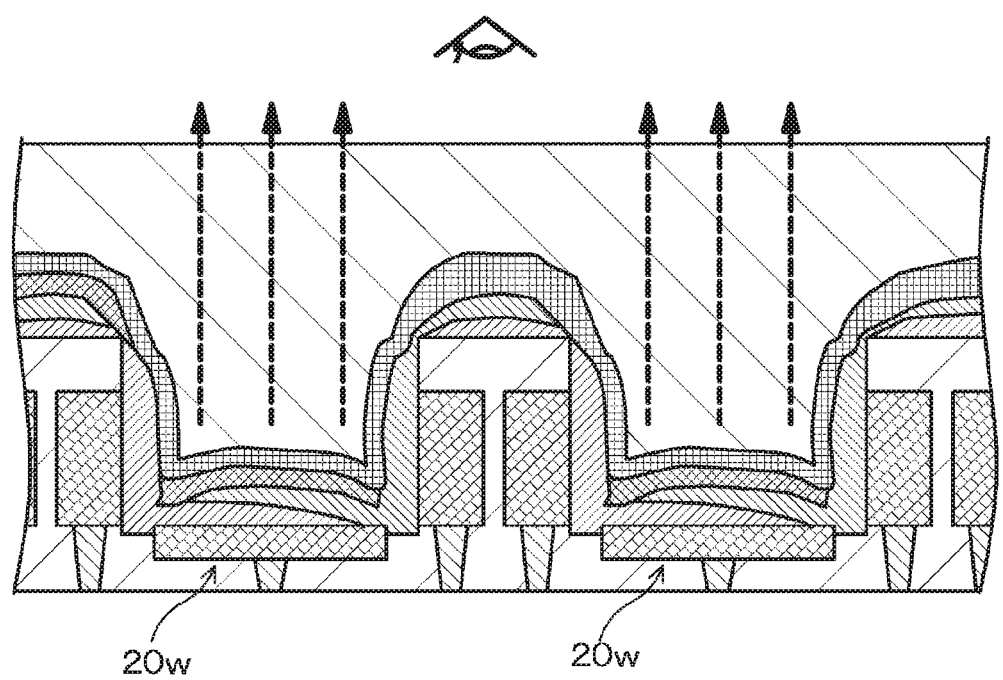
FIG. 4B is a schematic diagram illustrating a state of light emission of a subpixel of W.

Furthermore, light emitted on the anode electrodes 83r, 83g, 83b, and 83w of the respective colors of the subpixels 20r, 20g, 20b, and 20w of RGBW is directly emitted to the outside of the recess portion 82. In addition, the light is reflected by an electrode surface of an anode electrode of another color and emitted to the outside of the recess portion 82. Thus, light takeout efficiency can be enhanced and view angle dependency does not occur. FIG. 4A illustrates a state of light emission of the subpixel 20g of G, and FIG. 4B illustrates a state of light emission of the subpixel 20w of W.

Furthermore, in the pixel structure according to the first embodiment, by the oblique evaporation, films of the organic EL layers 84g, 84r, and 84b of the respective colors are formed in the order of G, R, and B, for example. Therefore, in sequentially forming the subpixels 20r, 20g, and 20b of RGB, the organic EL layers 84g, 84r, and 84b of the respective colors are sequentially formed also on the bottom surface of the recess portion 82. Thus, simultaneously with sequentially forming the subpixels 20r, 20g, and 20b of RGB, the subpixel 20w of W can be formed by the stacked layer of the organic EL layer 84g of G, the organic EL layer 84r of R, and the organic EL layer 84b of B, which is advantageous.

Figure 5:
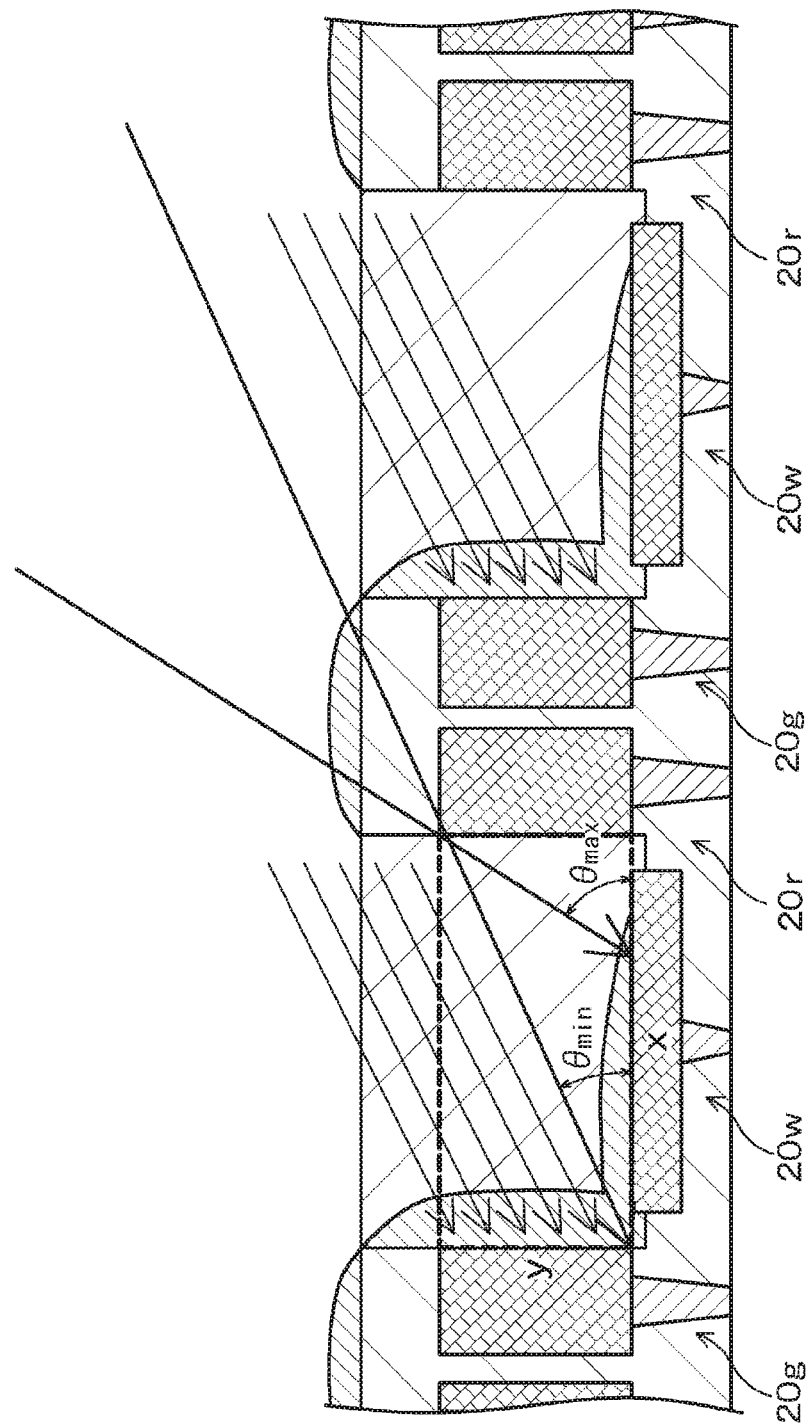
FIG. 5 is an explanatory diagram illustrating the setting of an incident critical angle of oblique evaporation.

As illustrated in FIG. 5, an incident angle in the oblique evaporation is set in such a manner as to set an incident critical angle, that is to say, the maximum incident angle $\theta_{max}$ and the minimum incident angle $\theta_{min}$ on the basis of a size x in a width direction of the bottom anode electrode (anode electrode 83w of W), and a size y in a depth direction of the side anode electrode (for example, anode electrode 83g of G). By setting the incident critical angle ($\theta_{max}$, $\theta_{min}$) in this manner, as described above, in sequentially forming the subpixels 20r, 20g, and 20b of RGB, the subpixel 20w of W including the stacked layer of the organic EL layer 84g of G, the organic EL layer 84r of R, and the organic EL layer 84b of B can be formed.

Second Embodiment

Figure 6:
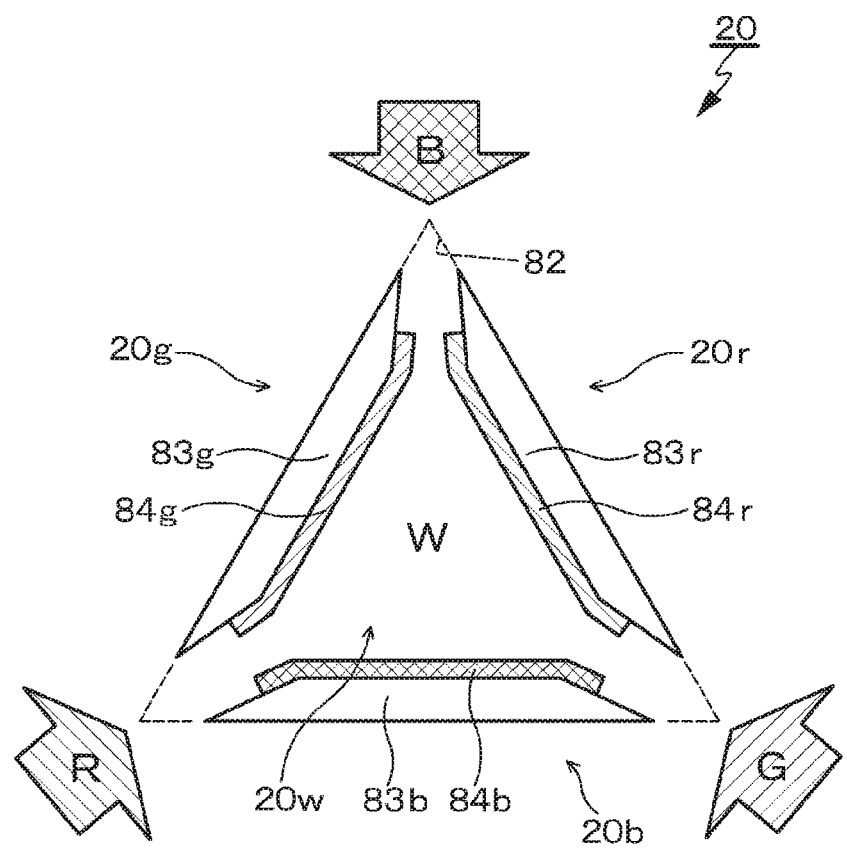
FIG. 6 is a plan view illustrating a pixel structure according to a second embodiment.
Figure 7:
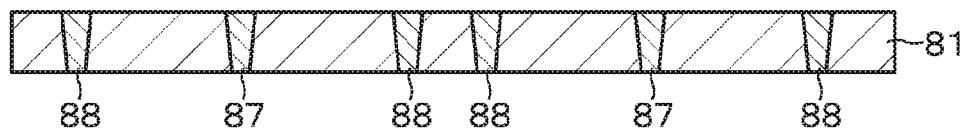
FIG. 7 is a process diagram (1) illustrating a flow of a process of a manufacturing method of a pixel structure according to a third embodiment.
Figure 7:
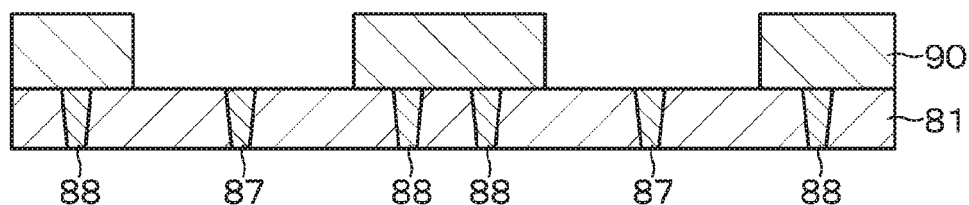
Figure 7:
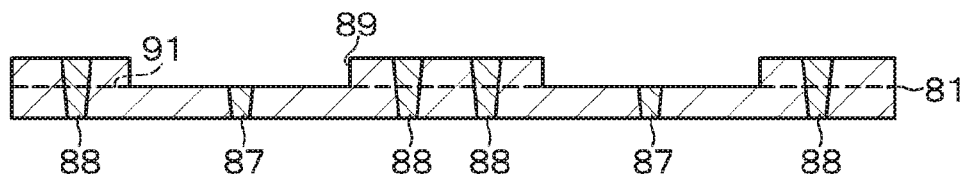
Figure 7:
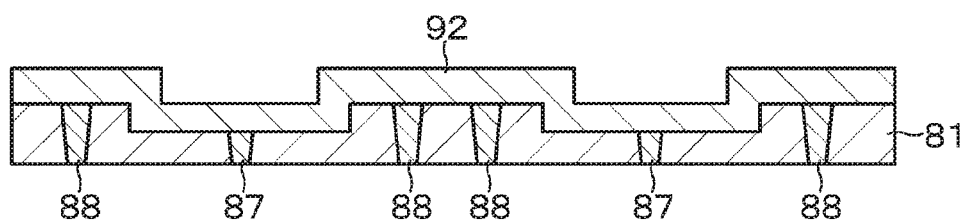
Figure 7:
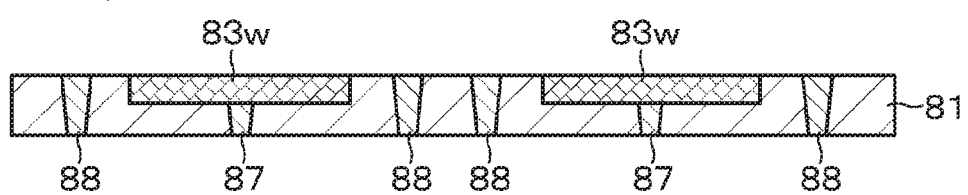
Figure 8:
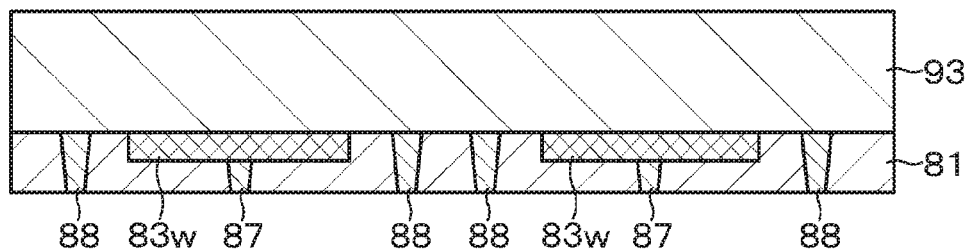
FIG. 8 is a process diagram (2) illustrating a flow of a process of a manufacturing method of a pixel structure according to a third embodiment.
Figure 8:
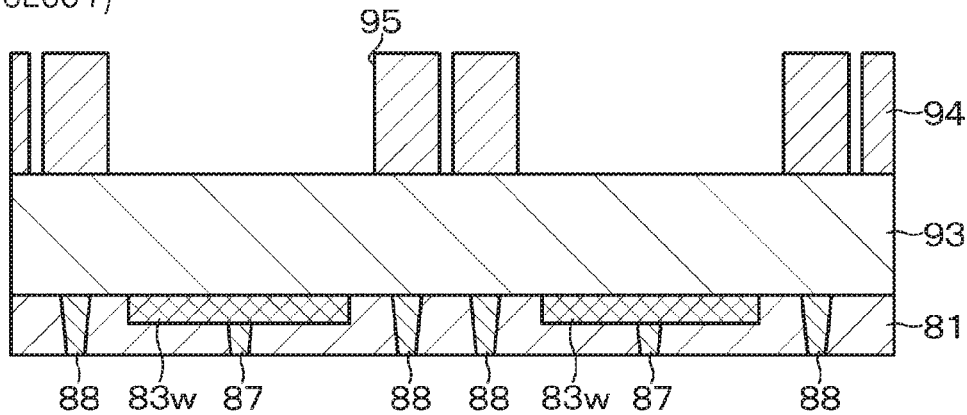
Figure 8:
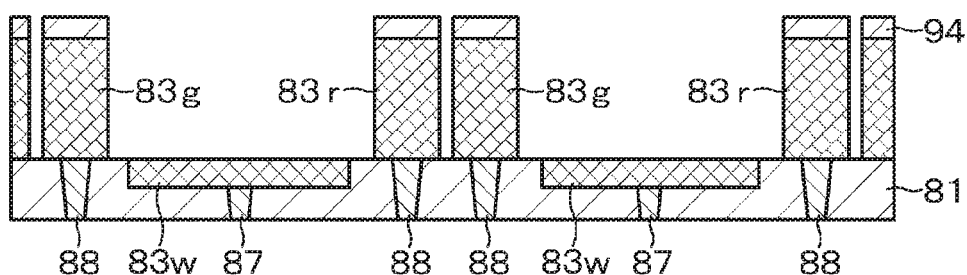
Figure 8:
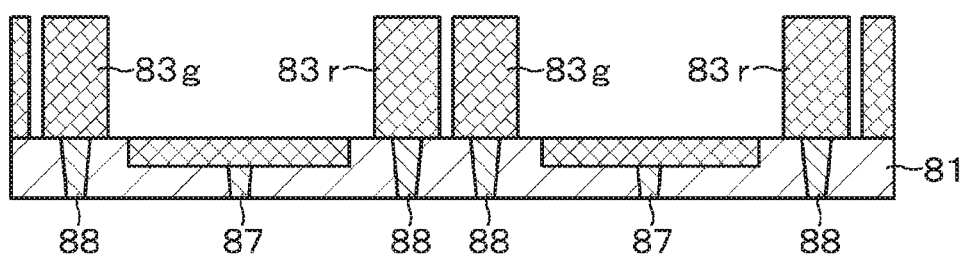
Figure 9:
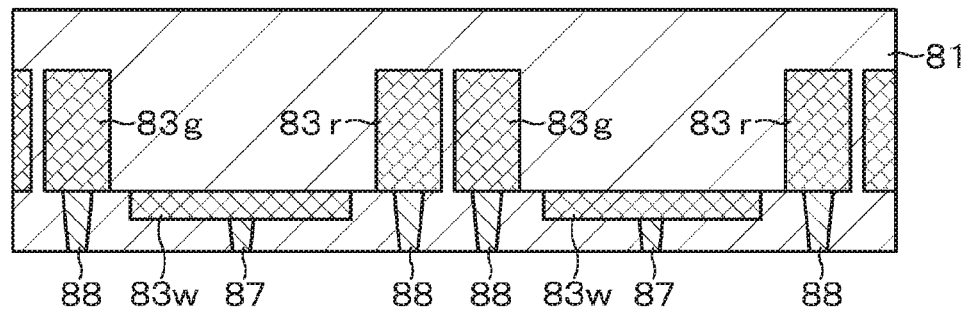
FIG. 9 is a process diagram (3) illustrating a flow of a process of a manufacturing method of a pixel structure according to a third embodiment.
Figure 9:
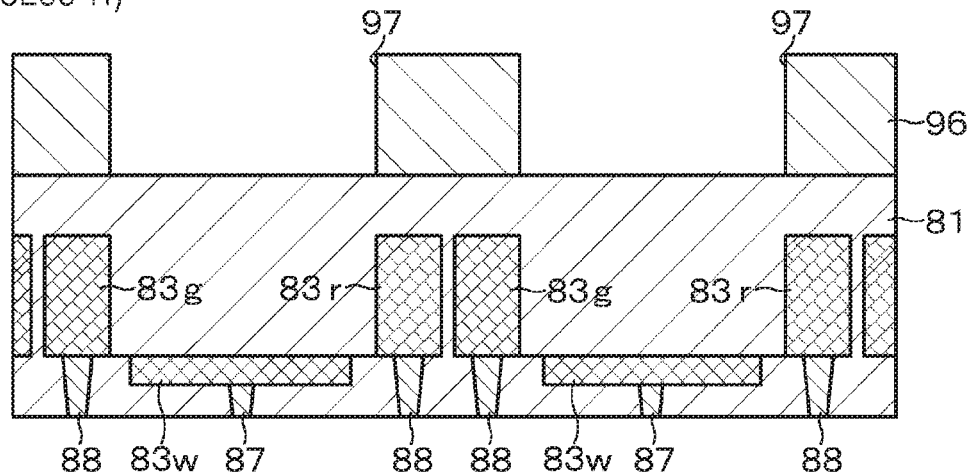
Figure 9:
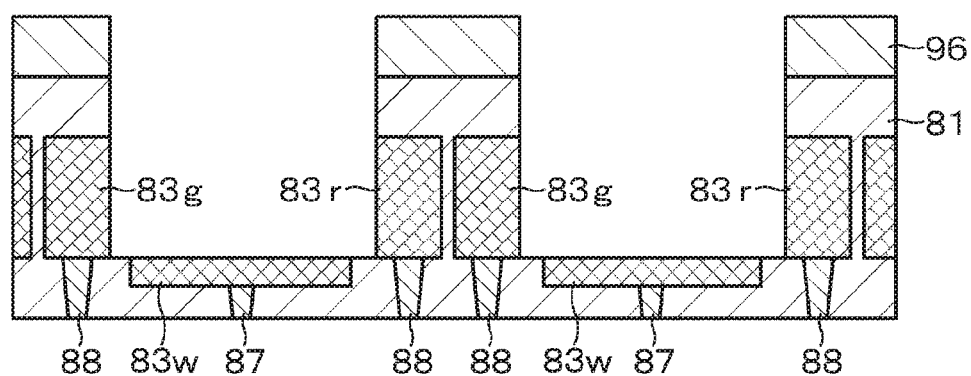
Figure 10:
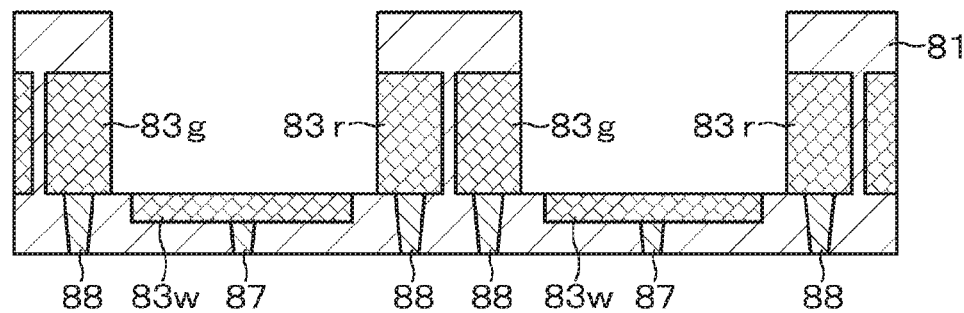
FIG. 10 is a process diagram (4) illustrating a flow of a process of a manufacturing method of a pixel structure according to a third embodiment.
Figure 10:
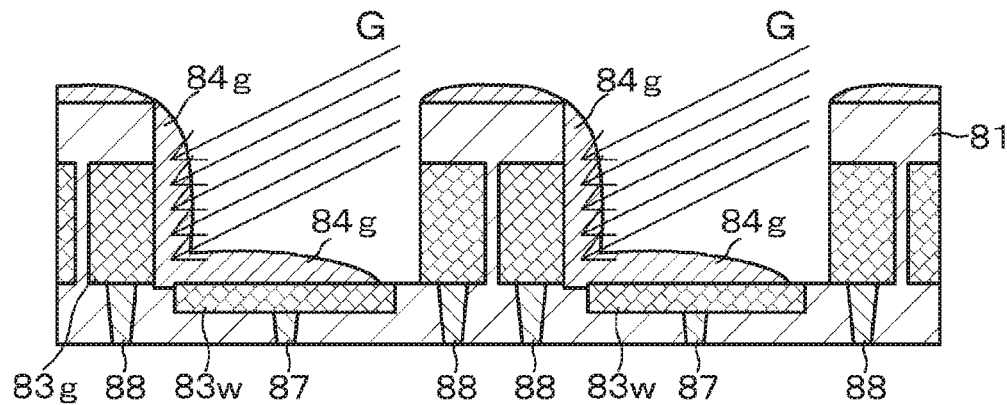
Figure 10:
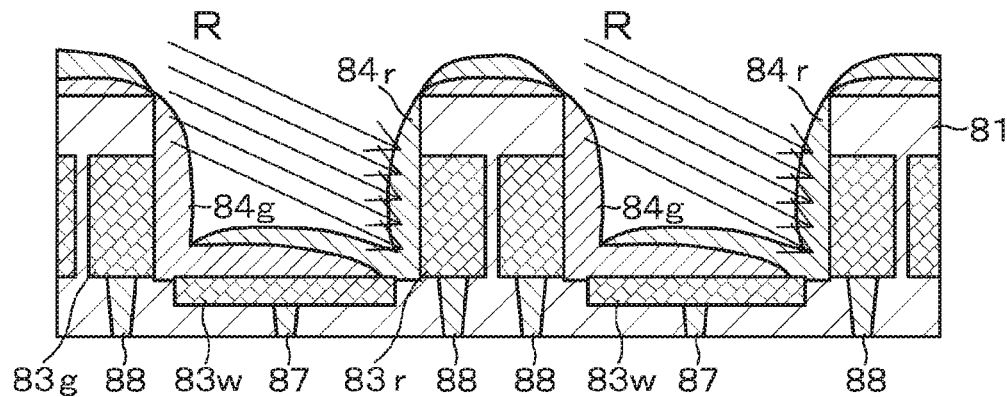
Figure 11:
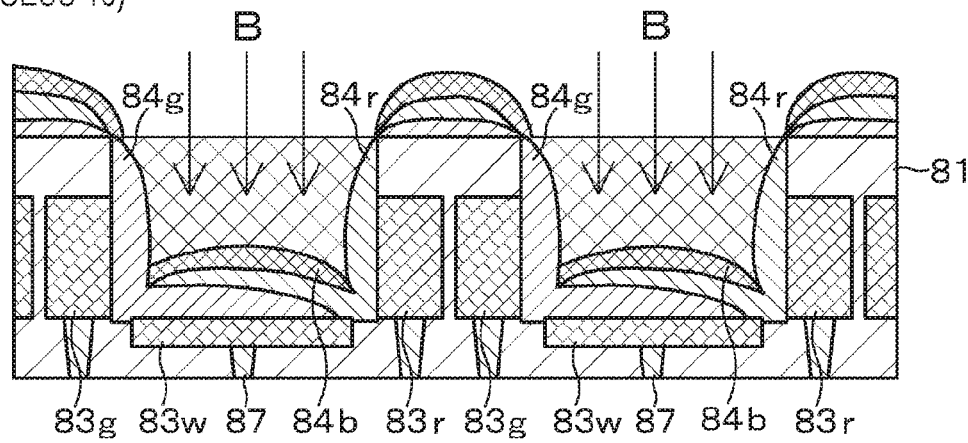
FIG. 11 is a process diagram (5) illustrating a flow of a process of a manufacturing method of a pixel structure according to a third embodiment.
Figure 11:
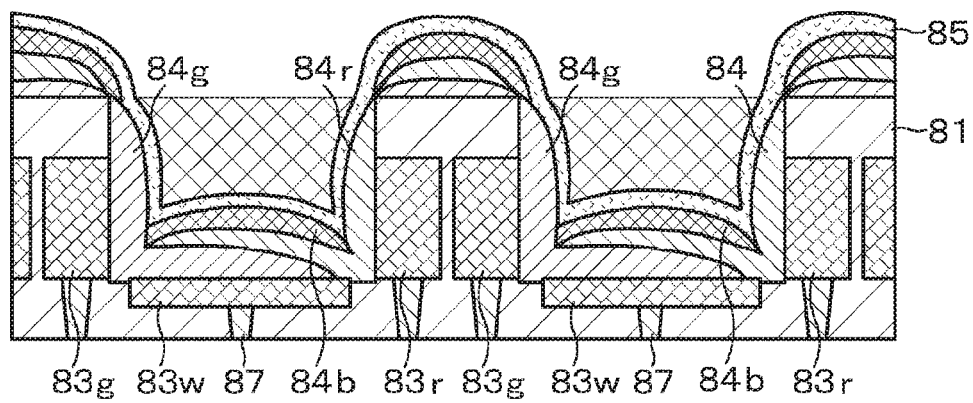
Figure 11:
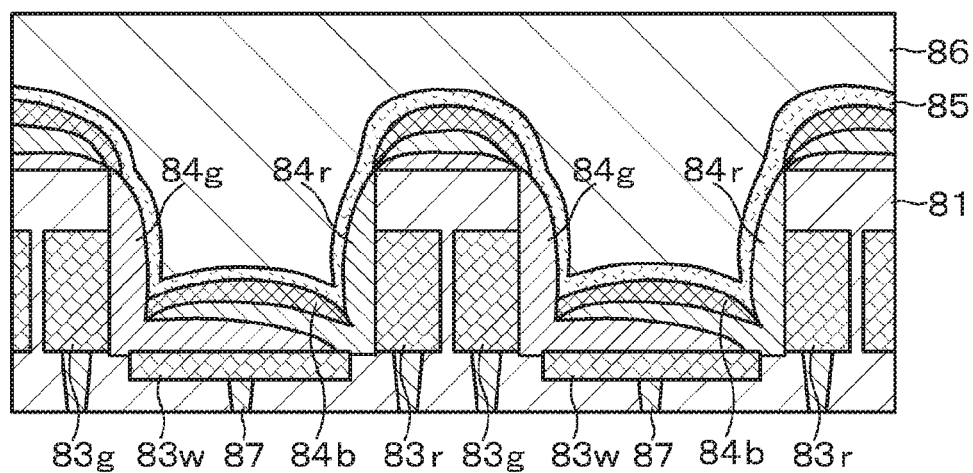

The second embodiment is a modified example of the first embodiment, and is another example of the shape of the recess portion 82. FIG. 6 illustrates a plan view of a pixel structure according to the second embodiment.

In the pixel structure according to the first embodiment, in a planar view, the recess portion 82 has a substantially circular shape, and has a configuration divided into three in a circumferential direction. In contrast to this, in the pixel structure according to the second embodiment, the recess portion 82 has a configuration with a substantially triangular shape in a planar view. Then, the subpixels 20r, 20g, and 20b of RGB are formed on the respective side walls corresponding to the sides of the triangle, and the subpixel 20w of W is formed on the bottom surface. The formation of the subpixels 20r, 20g, 20b, and 20w of RGBW can be performed by oblique evaporation similarly to the first embodiment. In FIG. 6, arrows respectively indicate film formation directions of RGB by oblique evaporation.

Third Embodiment

The third embodiment is an example of a manufacturing method of the pixel structure according to the first embodiment, that is to say, a pixel structure in which the pixel 20 includes the subpixels 20r, 20g, 20b, and 20w of four colors of RGBW. FIGS. 7, 8, 9, 10, and 11 illustrate process diagrams of the manufacturing method of the pixel structure according to the third embodiment. The oblique evaporation is used for the film formation of organic EL material of the subpixels 20r, 20g, 20b, and 20w of RGBW.

In the interlayer insulating film 81 serving as a base film, contact plugs 87 and 88 for electrically connecting a wiring line including aluminum (Al) or copper (Cu), the anode electrode 83w being a bottom anode electrode, and the anode electrodes 83r, 83g, and 83b being side anode electrodes are formed (process 1). As the material of the interlayer insulating film 81, SiO, SiON, SiN, SiOC, and the like can be exemplified. As the material of the contact plugs 87 and 88, tungsten (W) and the like can be exemplified.

Normally, one pixel includes three subpixels 20r, 20g and 20b of RGB, but in the present embodiment, one pixel includes the four subpixels 20r, 20g, 20b, and 20w of RGBW. As an example, a size of one pixel is about 1 to 30 μm.

Next, for forming a recess (groove) 89 for forming a buried bottom anode electrode, that is to say, for forming the anode electrode 83w of W, a photoresist 90 for i-ray or KrF is patterned on the interlayer insulating film 81 serving as a base film, exposure and development are performed, and the photoresist 90 is opened only at a position of the anode electrode 83w of W (process 2).

Next, the interlayer insulating film 81 is processed by 5 nm or more, for example, using F-based etching gas on the basis of the photoresist 90 patterned in the process 2, and the recess 89 is formed (process 3). Here, by preliminarily forming an etch stop layer 91 indicated by a broken line in the drawing, in the interlayer insulating film 81, a film thickness of the anode electrode 83w of W can be made uniform. Thereafter, O2 ashing and washing are performed.

Next, an electrode formation layer 92 for forming the anode electrode 83w of W in the recess 89 on the interlayer insulating film 81 is formed over the entire surface of the interlayer insulating film 81 (process 4). The electrode formation layer 92 that is to become the anode electrode 83w of W includes a stacked layer of titanium (Ti) and aluminum (Al), for example. In the formation of the electrode formation layer 92, for example, a film of Ti is formed with a film thickness of about 1 to 500 nm, a film of Al is formed with a film thickness of about 10 to 1 μm, and the Ti and Al films are stacked.

Next, the electrode formation layer 92 on the interlayer insulating film 81 that falls outside the recess 89 is scraped by chemical mechanical polishing (CMP) or etching, and the anode electrode 83w of W is formed. (process 5). At this time, overetching is performed until the contact plug 88 for the side anode electrode is completely exposed to the surface of the interlayer insulating film 81.

Next, on the anode electrode 83w of W and the contact plug 88 for the side anode electrode that have been exposed by CMP or etch back, an electrode formation layer 93 for forming the side anode electrodes, that is to say, the anode electrodes 83r, 83g, and 83b of RGB is formed (process 6). At this time, the electrode formation layer 93 is formed in such a manner that a film thickness ratio with the maximum size of the bottom anode electrode falls within a range of 0.5 to 2, for example. As the material of the electrode formation layer 93 that is to become the anode electrodes 83r, 83g, and 83b of RGB, for example, Al can be exemplified.

Next, a photoresist 94 for i-ray or KrF is formed on the electrode formation layer 93, exposure and development are performed, and an opening 95 of the bottom anode electrode is formed, and a mask for processing for separating the side anode electrode is formed (process 7).

Next, by etching the electrode formation layer 93 using Cl-based gas, the anode electrode 83w W being a bottom anode electrode is surfaced, and the anode electrodes 83r, 83g, and 83b of RGB being side anode electrodes are formed (process 8).

Next, the photoresist 94 is removed by O2 ashing, and thereafter, residue is removed by washing (process 9).

Next, the formed bottom anode electrode and side anode electrode are buried back into the interlayer insulating film 81 (process 10). At this time, the film thickness of the interlayer insulating film 81 is made thicker than the height of the side anode electrode. Nevertheless, it is important that the film thickness of the interlayer insulating film 81 is not too thick. This is because, if the interlayer insulating film 81 on the side anode electrode is too thick, it becomes difficult to perform oblique evaporation to be described later.

Next, a photoresist. 96 is applied for an opening of the bottom anode electrode and the side anode electrode, the photoresist 96 is patterned by exposure and development, and an opening 97 of the bottom anode electrode and the side anode electrode is formed (process 11).

Next, etch back is performed in such a manner that the opening 97 of the photoresist 96 is formed until the bottom anode electrode is exposed (process 12). At this time, a processing end point is detected by a signal attributed to the interlayer insulating film 81.

Next, the photoresist 96 is removed by O2 ashing, and thereafter, residue is removed by washing (process 13).

Next, by performing oblique evaporation of organic EL material of G toward the anode electrode 83g of G among anode electrodes on the three surfaces of the side surfaces of the recess portion 82, the organic EL layer 84g of G is formed (process 14). At this time, a film of organic EL material of G is simultaneously formed also on the anode electrode 83w of W of the bottom surface of the recess portion 82.

At the time of the oblique evaporation, by adjusting the relative positions of the substrate and an evaporation source of the organic EL material, it is necessary to control an incident angle θ of the organic EL material (light emission material) with respect to the bottom surface of the recess portion 82. In other words, by setting the incident angle θ of the organic EL material, in performing oblique evaporation of organic EL material of G, a film of organic EL material of G can be formed also on the anode electrode 83w of W of the bottom surface of the recess portion 82. The incident angle θ here refers to the incident critical angle described with reference to FIG. 5, that, is to say, the maximum incident angle $θ_{max}$ and the minimum incident angle $θ_{min}$.

Next, by performing oblique evaporation of organic EL material of R toward the anode electrode 83r of R, the organic EL layer 84r of R is formed (process 15). At this time, a film of organic EL material of R is simultaneously formed also on the anode electrode 83w of W of the bottom surface of the recess portion 82.

Next, by performing oblique evaporation of organic EL material of B toward the anode electrode 83b of B, the organic EL layer 84b of B is formed (process 16). At this time, a film of the organic EL material is simultaneously formed also on the anode electrode 83w of W of the bottom portion of the recess portion 82. As a result, a stacked layer of GRB is formed on the anode electrode 83w of W.

Next, the cathode electrode 85 including a transparent electrode is formed with a film thickness of 5 nm to 5 μm, for example, by sputtering (process 17). Note that, by forming a thick cathode electrode 85 including a transparent electrode, the cathode electrode 85 can also serve as a protection film. As the material of the cathode electrode 85, indium tin oxide (ITO), indium zinc oxide (IZO), or the like can be exemplified. Furthermore, the cathode electrode 85 can also be formed by forming a thin film by a specific alloy (for example, Mg, Ag, or the like).

Next, for protecting the organic EL layers 84g, 84r, 84b, and 84w and the cathode electrode 85, a protection layer 86 is formed (process 18). As the protection layer 86, it is preferable to form a film of SiN, SiON, organic resin, or the like that has high protection performance, as a single layer or in a stacked layer structure. The total film thickness of the protection layer 86 becomes about 0.3 μm to 10 μm, for example. It is also possible to form a protection film using Al. In this case, a bottom anode electrode is formed using a transparent film such as ITO.

As described above, according to the manufacturing method of the pixel structure according to the third embodiment, by oblique evaporation, films of the organic EL material of the respective colors can be formed on the side walls of the recess portion 82 in the order of G, R, and B, for example. Then, in forming these films of the organic EL material of the respective colors, the films of the organic EL material of the respective colors are sequentially formed and stacked also on the bottom surface of the recess portion 82. Thus, simultaneously with sequentially forming the subpixels 20r, 20g, and 20b of RGB, the subpixel 20w of W can be formed.

Note that, in the above-described example, the films of the organic EL material of the respective colors are formed on the side walls of the recess portion. 82 in the order of G, R, and B. Nevertheless, the order of the film formation is not limited to this order, and the organic EL layers 84g, 84r, and 84b can be performed in an arbitrary order.

Fourth Embodiment

Figure 12A:
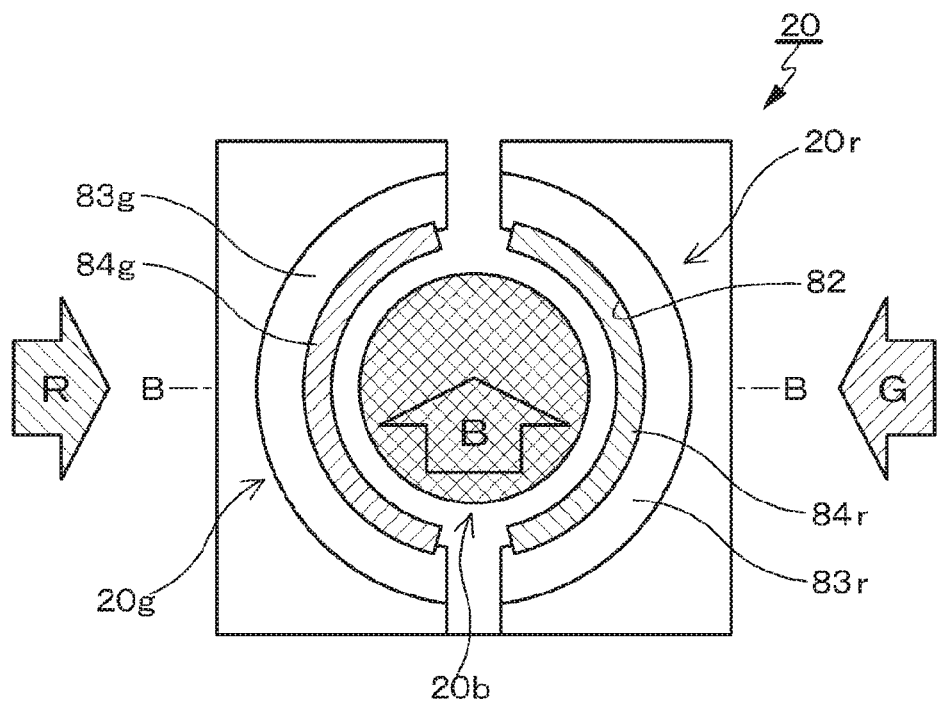
FIG. 12A is a plan view illustrating a pixel structure according to the fourth embodiment.
Figure 12B:
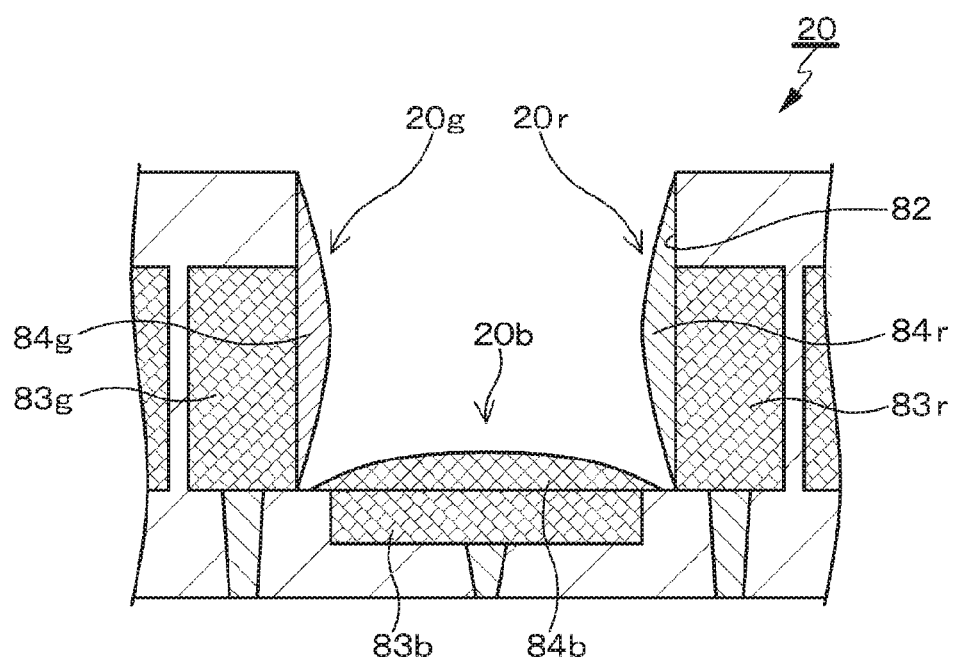
FIG. 12B is a cut portion end surface diagram taken along a B-B line in FIG. 12A.

The fourth embodiment is an example in which the pixel 20 includes the subpixels 20r, 20g, and 20b of three colors of RGB. FIG. 12A illustrates a plan view of a pixel structure according to the fourth embodiment, and FIG. 12B illustrates a cut portion end surface diagram taken along a B-B line in FIG. 12A. Here, it is also assumed that the organic EL element 21 and the drive circuit thereof are formed on a semiconductor substrate such as a silicon substrate.

The pixel structure according to the fourth embodiment has a configuration in which a plurality of recess portions 82 corresponding to the number of pixels 20 is provided on the top surface of the interlayer insulating film 81, which is a pixel formation surface, and the pixel 20 including the subpixels 20r, 20g, and 20b of three colors of RGB is arranged in each of the plurality of recess portions 82. In other words, the pixel structure according to the fourth embodiment has a stereoscopic arrangement structure in which the pixel 20 including the subpixels 20r, 20g, and 20b of three colors of RGB is arranged in each of the plurality of recess portions 82.

In a planar view, the plurality of recess portions 82 has a substantially circular shape, for example, and has a configuration divided into two in a circumferential direction. In the present embodiment, the side wall of the recess portion 82 is illustrated in the drawing as a vertical surface vertical to the pixel formation surface, but the side wall needs not be always a vertical surface, and may be an inclined surface inclining in a direction in which an opening of the recess portion 82 widens.

In the pixel structure according to the fourth embodiment, the use of the side wall and the bottom surface (bottom portion) of the recess portion 82 enables the pixel 20 including the subpixels 20r, 20g, and 20b of three colors of RGB to be arranged in one recess portion 82. Specifically, the respective organic EL elements 21 of the subpixels 20r and 20g of RB are formed on the two-divided side walls of the recess portion 82, and the organic EL element 21 of the subpixel 20b of B is formed on the bottom surface of the recess portion 82.

FIG. 12B illustrates cross-sectional structures of the subpixel 20g of G, the subpixel 20r of R, and the subpixel 20b of B. Respective anode electrodes 83g and 83r of the subpixels 20g and 20r are buried in the side wall of the recess portion 82 as side anode electrodes, and an anode electrode 83b of the subpixel 20b is buried in the bottom surface of the recess portion 82 as a bottom anode electrode. In a planar view, the anode electrodes 83g and 83r being side anode electrodes have a substantially circular shape. The material of the anode electrode is similar to the case of the first embodiment.

Then, also in the pixel structure according to the fourth embodiment, similarly to the case of the pixel structure according to the first embodiment, by performing oblique evaporation with respect to a side anode electrode, an organic EL layer being a light emission layer is formed. Arrows illustrated in FIG. 12A respectively indicate film formation directions of RGB. Note that the film formation direction of B is a direction vertical to the bottom surface of the recess portion 82. In the case of the present embodiment, for example, an organic EL layer of each color is formed in the order of G, B, and B.

First of all, a film of an organic EL layer 84g of G is formed on an anode electrode 83g of G by oblique evaporation. In this case, evaporation is performed in such a manner that a film of organic EL material of G is formed on the side wall of the recess portion 82. Next, a film of an organic EL layer 84r of R is formed on an anode electrode 83r of R by oblique evaporation. Also in this case, evaporation is performed in such a manner that a film of organic EL material of R is formed on the side wall of the recess portion 82. Then, lastly, a film of an organic EL layer 84g B is formed on the anode electrode 83b of B provided on the bottom surface of the recess portion 82.

As described above, the pixel structure according to the fourth embodiment is a pixel structure in which the pixel 20 including the subpixels 20r, 20g, and 20b of RGB is sterically arranged in each of the plurality of recess portions 82 formed on the pixel formation surface. In the pixel structure, the size of the bottom surface of the recess portion 82 on which the subpixel 20b of B is formed corresponds to the size of one subpixel in a case where the subpixels 20r, 20g, and 20b of RGB are planarly arranged.

In other words, according to the pixel structure according to the fourth embodiment, by the stereoscopic arrangement of the pixel 20 that uses the side wall and the bottom surface of the recess portion 82, because the pixel 20 including the subpixels 20r, 20g, and 20b of RGB can be arranged in the size of the subpixel, higher definition can be achieved even using the color coding method. Furthermore, light emitted on the anode electrodes 83r, 83g, and 83b of the respective colors of the subpixels 20r, 20g, and 20b of RGB is directly emitted to the outside of the recess portion 82. In addition, the light is reflected by an electrode surface of an anode electrode of another color and emitted to the outside of the recess portion 82. Thus, light takeout efficiency can be enhanced and view angle dependency does not occur.

Figure 13:
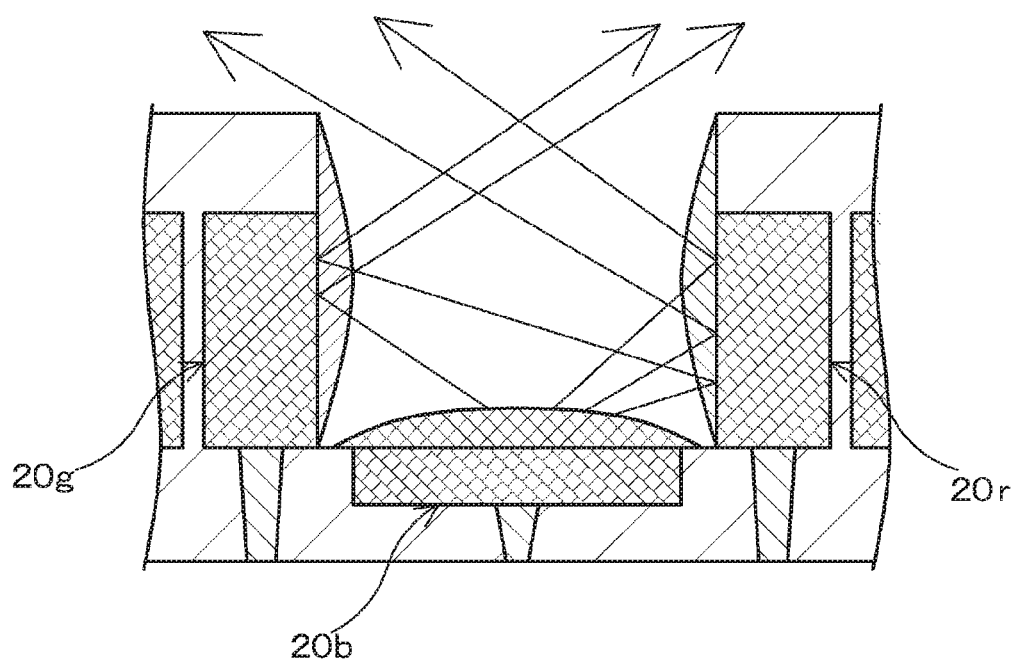
FIG. 13 is a schematic diagram illustrating a state of light emission of subpixel of B.

FIG. 13 illustrates a state of light emission of the subpixel 20b of B provided on the bottom surface of the recess portion 82. FIG. 13 illustrates a state in which light emitted on the anode electrode 83b of the subpixel 20b of B is reflected by an electrode surface of the anode electrode 83r of the subpixel 20r of R and an electrode surface of the anode electrode 83g of the subpixel 20g of G, and emitted to the outside of the recess portion 82.

Fifth Embodiment

Figure 14A:
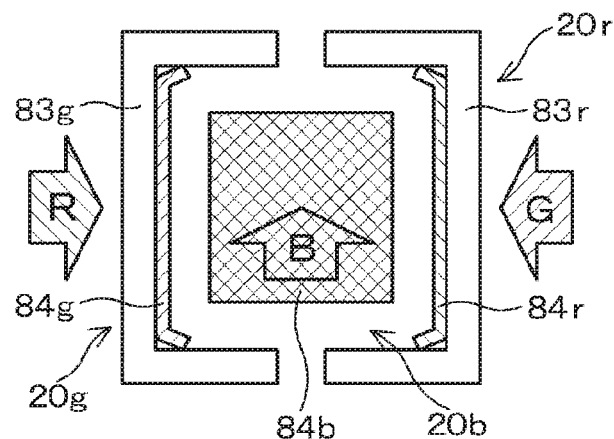
FIGS. 14A, 14B, and 14C illustrate another example of a shape of a side anode electrode.
Figure 14B:
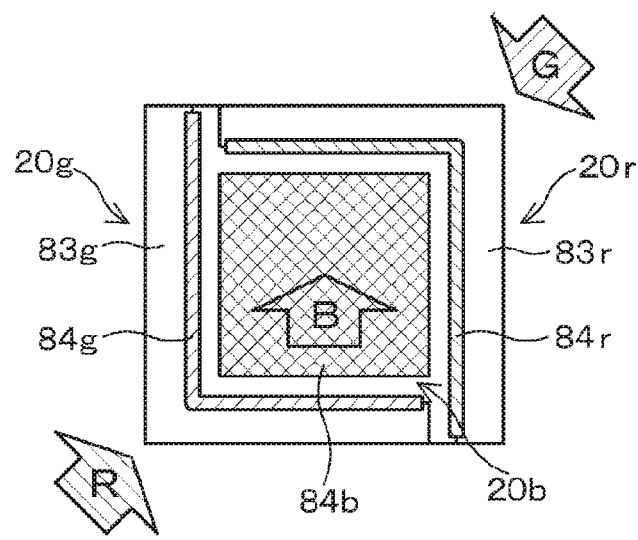
Figure 14C:
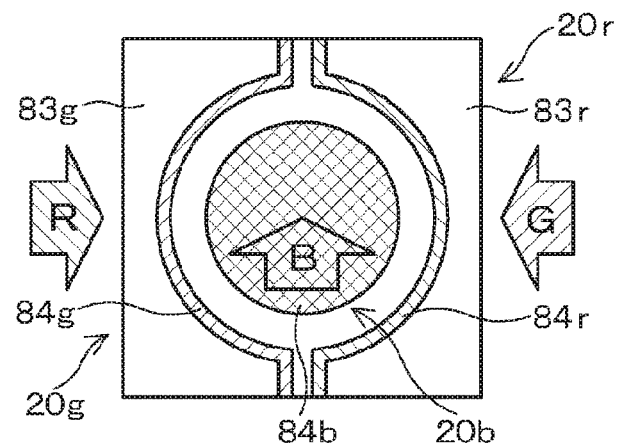

The fifth embodiment is a modified example of the fourth embodiment, and is another example of the shape of the anode electrodes 83g and 83r serving as side anode electrodes. FIGS. 14A, 14B, and 14C illustrate plan views of a pixel structure according to the fifth embodiment. In FIGS. 14A, 14B, and 14C, arrows indicate film formation directions of organic EL material.

In an image structure according to the fourth embodiment, in a planar view, the anode electrodes 83g and 83r of GR have a substantially circular shape, and the anode electrodes 83g and 83r are arranged in an opposed manner. In contrast to this, in an image structure according to the fifth embodiment, in a planar view, the anode electrodes 83g and 83r of OR have shapes illustrated in FIGS. 14A, 14B, and 14C.

Specifically, in the example illustrated in FIG. 14A, in a planar view, the anode electrodes 83g and 83r of GR have a substantially pointed U-shape, the anode electrodes 83g and 83r having a substantially pointed U-shape are arranged into a rectangular shape in an opposed manner, and organic EL layers 84g and 84r of GR are formed inside the anode electrodes 83c and 83r. In this case, in a planar view, an organic EL layer 84b of B formed on the bottom surface of the recess portion 82 has a rectangular shape.

Specifically, in the example illustrated in FIG. 14B, in a planar view, the anode electrodes 83g and 83r of GR have a substantially L-shape, the anode electrodes 83g and 83r having a substantially L-shape are arranged into a rectangular shape in an inversely-opposed manner, and organic EL layers 84g and 84r of GR are formed inside the substantially L-shape of the anode electrodes 83g and 83r. In this case, in a planar view, an organic EL layer 84b of B formed on the bottom surface of the recess portion 82 has a rectangular shape.

Specifically, in the example illustrated in FIG. 14B, in a planar view, inner surfaces of the anode electrodes 83g and 63r of GR have a substantially semicircular shape, the anode electrodes 83g and 83r with inner surfaces having a substantially semicircular shape are arranged in an opposed manner, and organic EL layers 84g and 84r of GR are formed on the inner surfaces of the substantially semicircular shape of the anode electrodes 83g and 83r. In this case, in a planar view, an organic EL layer 84b of B formed on the bottom surface of the recess portion 82 has a circular shape.

Sixth Embodiment

Figure 15:
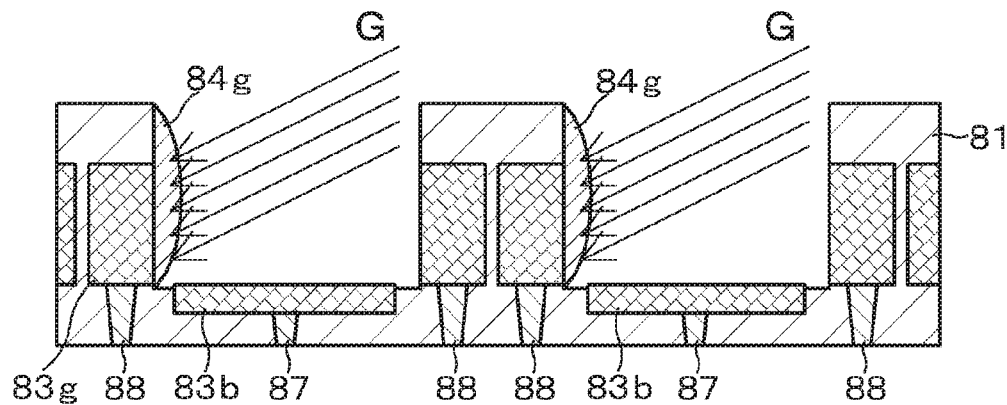
FIG. 15 is a process diagram (1) illustrating a flow of a process of a manufacturing method of a pixel structure according to a sixth embodiment.
Figure 15:
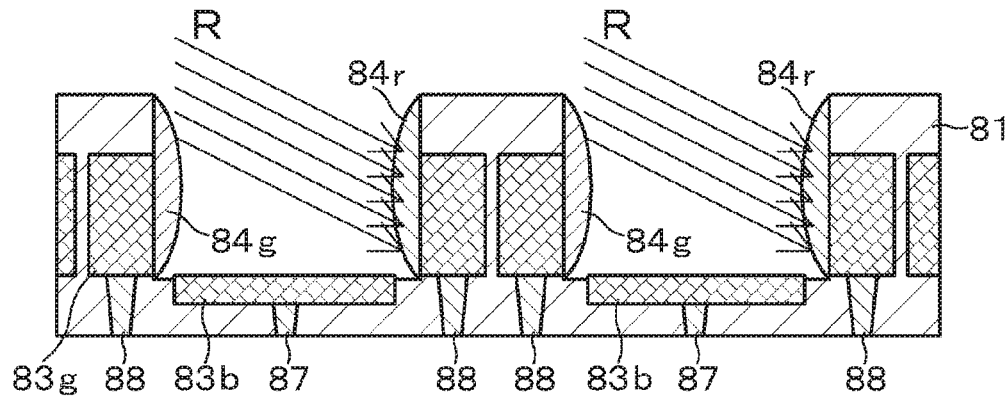
Figure 16:
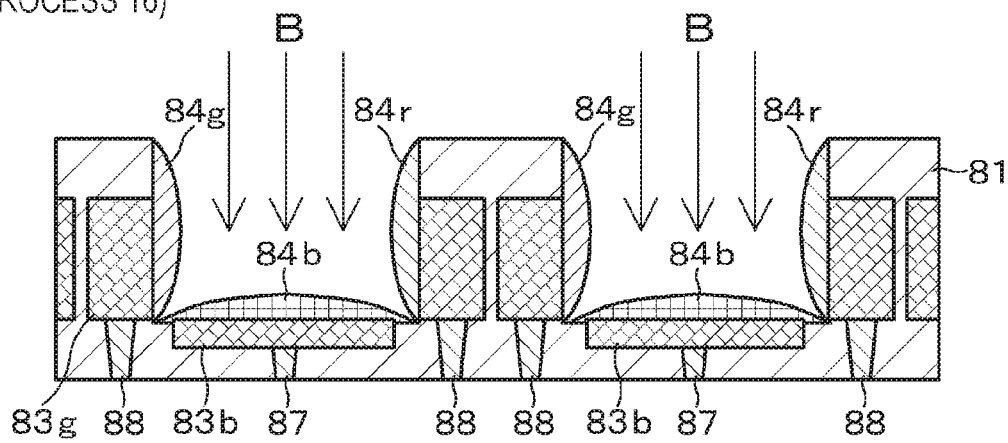
FIG. 16 is a process diagram (2) illustrating a flow of a process of a manufacturing method of a pixel structure according to the sixth embodiment.
Figure 16:
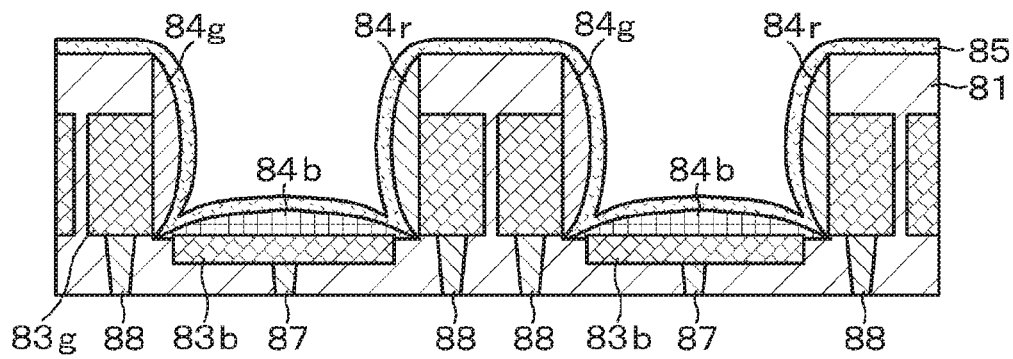
Figure 16:
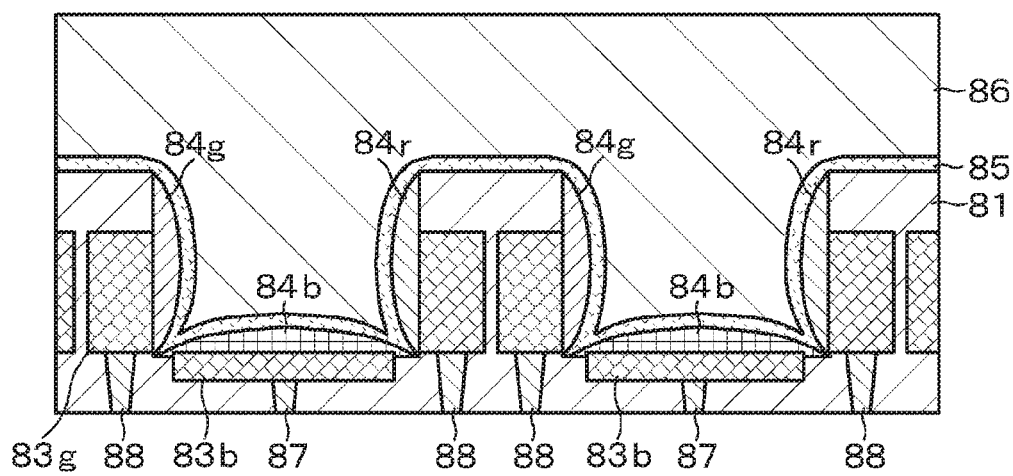

The sixth embodiment is an example of a manufacturing method of the pixel structure according to the fourth embodiment, that is to say, a pixel structure in which the pixel 20 includes the subpixels 20r, 20g, and 20b of three colors of RGB. FIGS. 15 and 16 illustrate process diagrams of the manufacturing method of the pixel structure according to the sixth embodiment. The oblique evaporation is used for the film formation of organic EL material of the subpixels 20r and 20g of RG.

The processing in processes 1 to 13 is the same processing as the processing in the processes 1 to 13 in the case of the third embodiment. Nevertheless, because the pixel 20 includes the subpixels 20r, 20g, and 20b of three colors of RGB in the pixel structure, as for an anode electrode of the bottom surface of the recess portion 82, the anode electrode 83w of W in the case of the third embodiment is replaced with the anode electrode 83b of B.

After etch back is performed until the anode electrode 83b of B being a bottom anode electrode is exposed, by performing oblique evaporation of organic EL material of G toward the anode electrode 83g of G among anode electrodes on the two surfaces of the side surfaces of the recess portion 82, the organic EL layer 84g of G is formed (process 14). At this time, by adjusting the relative positions of the substrate and an evaporation source of the organic EL it is necessary to control an incident angle θ of the organic EL material with respect to the substrate of organic EL material in such a manner that a film of organic EL material of G is not formed on the anode electrode 83b of B of the bottom surface of the recess portion 82.

Next, by performing oblique evaporation of organic EL material of R toward the anode electrode 83r of R, the organic EL layer 84r of R is formed (process 15). At this time, similarly, it is necessary to control an incident angle θ of the organic EL material with respect to the substrate of organic EL material in such a manner that a film of organic EL material of R is not formed on the anode electrode 83b of B of the bottom surface of the recess portion 82.

Next, by performing evaporation of organic EL material of B toward the anode electrode 83b of B of the bottom surface of the recess portion 82, the organic EL layer 84b of B is formed (process 16). By the evaporation of the organic EL material of three colors, films of the organic EL layer 84g of P and the organic EL layer 84r of R are formed on the side walls of the recess portion 82, and the film of the organic EL layer 84b of B is formed on the bottom surface of the recess portion 82.

Next, the cathode electrode 85 including a transparent electrode is formed with a film thickness of 5 nm to 5 μm, for example, by sputtering (process 17). Note that, by forming a thick cathode electrode 85 including a transparent electrode, the cathode electrode 85 can also serve as a protection film. The material or the like of the cathode electrode 85 is similar to the case of the third embodiment.

Next, for protecting the organic EL layers 84g, 84r, and 84b, and the cathode electrode 85, a protection layer 86 is formed (process 18). The material or the like of the protection layer 86 is also similar to the case of the third embodiment.

Note that, in the above-described example, the description has been given of an example case where the subpixel 20g of G and the subpixel 20r of R are formed on the side walls of the recess portion 82, and the subpixel 20b of B is formed on the bottom surface of the recess portion 82, but the configuration is not limited to this. In other words, a pixel structure in which the subpixel 20g of G or the subpixel 20r of R is formed on the bottom surface of the recess portion 82 may be employed.

Modified Example

Heretofore, the technology of the present disclosure has been described on the basis of preferred embodiments, but the technology of the present disclosure is not limited to the embodiments. The configurations and structures of the display device described in the above-described embodiments are exemplifications, and can be appropriately changed.

Electronic Device of Present Disclosure

The above-described display device of the present disclosure can be used as a display unit (display device) of an electronic device in any field that displays a video signal input to the electronic device or a video signal generated in the electronic device, as an image or a video. As an electronic device, a television set, a mobile terminal device such as a laptop personal computer, a digital still camera, and a mobile phone, a head-mounted display, and the like can be exemplified. Nevertheless, the electronic device is not limited to these.

In this manner, by using the display device of the present disclosure as a display unit of an electronic device in any field, the following effects can be obtained. In other words, according to the display device of the present disclosure, higher definition is enabled using the color coding method, light takeout efficiency can be enhanced, and view angle dependency does not occur. Thus, the use of the display device of the present disclosure can contribute to higher definition and higher image quality of a display unit of the electronic device.

The display device of the present disclosure also includes a display device having a modular shape with a sealed configuration. As an example, a display module formed by attaching an opposing portion such as transparent glass to a pixel allay portion corresponds to such a display device. Note that the display module may be provided with a circuit unit or a flexible printed circuit (FPC) for inputting and outputting a signal and the like from the outside to the pixel allay portion, and the like. Hereinafter, as specific examples of an electronic device that uses the display device of the present disclosure, a digital still camera and a head-mounted display will be exemplified. Nevertheless, the specific examples exemplified here are mere examples, and the specific examples are not limited to these.

Specific Example 1

Figure 17A:
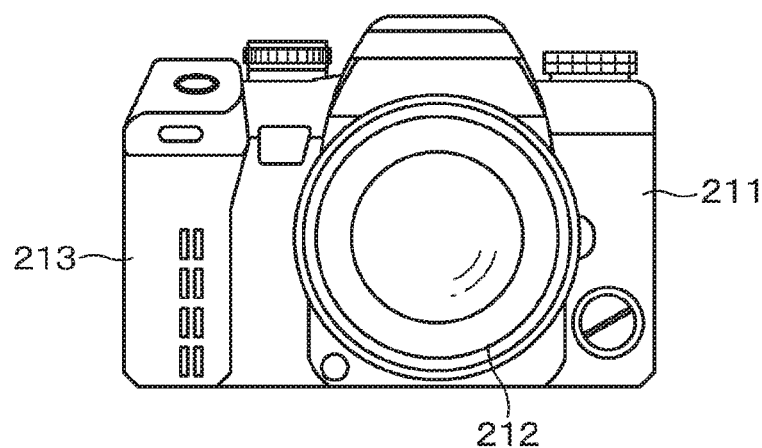
FIG. 17A is a front view of a digital still camera of a lens-interchangeable single-lens reflex type according to Specific Example 1 of an electronic device of the present disclosure.
Figure 17B:
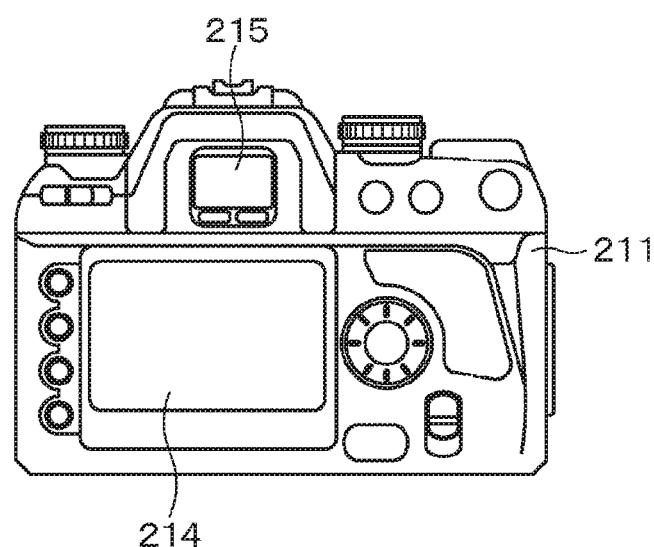
FIG. 17B is a rear view of the digital still camera.

FIG. 17 is an external view of a digital still camera of a lens-interchangeable single-lens reflex type according to Specific Example 1 of the electronic device according to the present disclosure. FIG. 17A illustrates a front view of the digital still camera, and FIG. 17B illustrates a rear view of the digital still camera.

The digital still camera of the lens-interchangeable single-lens reflex type according to this Specific Example 1 includes, for example, an interchangeable imaging lens unit (interchangeable lens) 212 on the front surface right side of a camera main body portion (camera body) 211, and a grip portion 213 to be gripped by a photographer, on the front surface left side.

Then, a monitor 214 is provided at the substantially center of the back surface of the camera main body portion 211. An electronic viewfinder (eyepiece window) 215 is provided above the monitor 214. By looking into the electronic viewfinder 215, the photographer can visually recognize an optical image of a subject that has been guided from the imaging lens unit 212, and decide a composition.

In the digital still camera of the lens-interchangeable single-lens reflex type having the above-described configuration, the display device of the present disclosure can be used as the electronic viewfinder 215. In other words, the digital still camera of the lens-interchangeable single-lens reflex type according to this Specific Example 1 can be manufactured using the display device of the present disclosure as the electronic viewfinder 215.

Specific Example 2

Figure 18:
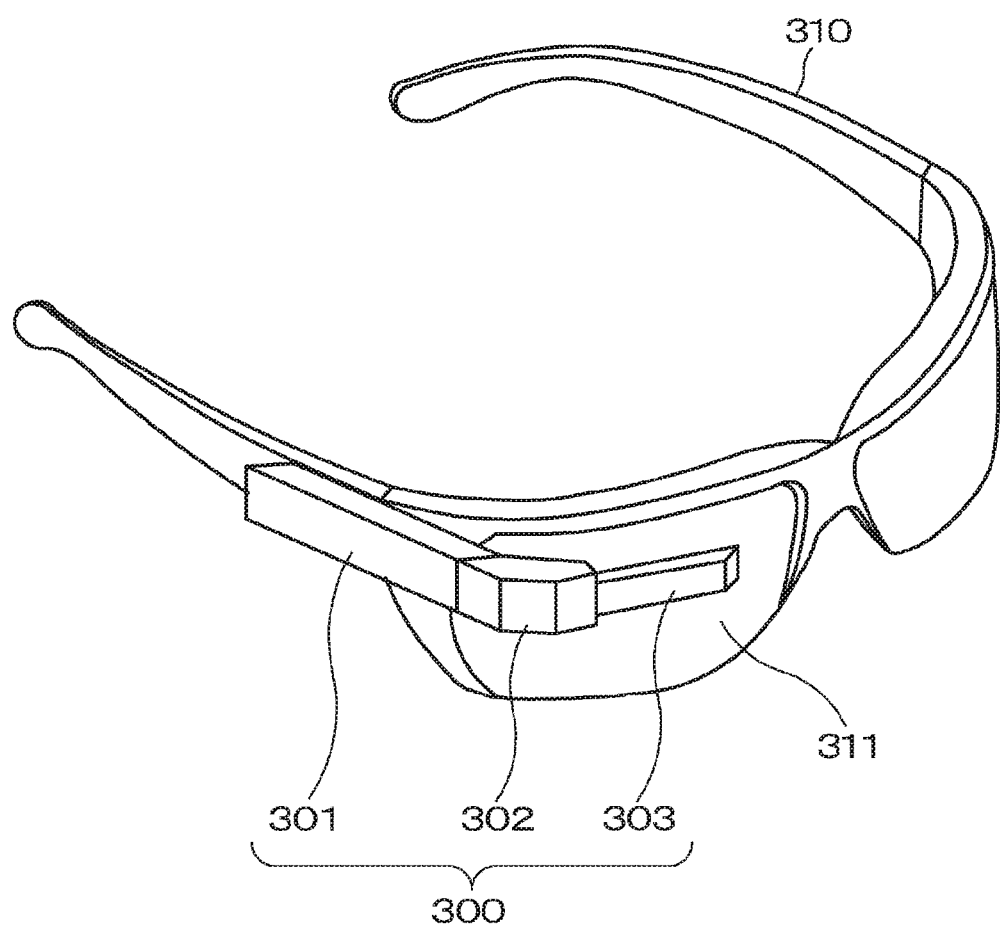
FIG. 18 is an external view illustrating an example of a head-mounted display according to Specific Example 2 of an electronic device of the present disclosure.

FIG. 18 is an external view illustrating an example of a head-mounted display according to Specific Example 2 of an electronic device of the present disclosure.

A head-mounted display 300 according to this Specific Example 2 has a transmissive type head-mounted display configuration including a main body portion 301, an arm portion 302, and a lens barrel 303. The main body portion 301 is connected with the arm portion 302 and glasses 310. Specifically, an end portion in a long side direction of the main body portion 301 is attached to the arm portion 302. Furthermore, one side of a side surface of the main body portion 301 is coupled to the glasses 310 via a connection member (not illustrated). Note that the main body portion 301 may be directly attached to a head portion of a human body.

The main body portion 301 incorporates a control board and a display unit for controlling an operation of the head-mounted display 300. The arm portion 302 supports the lens barrel 303 with respect to the main body portion 301 by coupling the main body portion 301 and the lens barrel 303. Specifically, the arm portion 302 fixes the lens barrel 303 to the main body portion 301 by bonding an end portion of the main body portion 301 and an end portion of the lens barrel 303. Furthermore, the arm portion. 302 incorporates a signal line for communicating data regarding an image provided from the main body portion. 301 to the lens barrel 303.

The lens barrel 303 projects image light provided from the main body portion. 301 through the arm portion 302, toward eyes of a user wearing the head-mounted display 300, through lenses 311 of the glasses 310.

In the head-mounted display 300 having the above-described configuration, the display device of the present disclosure can be used as the display unit incorporated in the main body portion 301. In other words, the head-mounted display 300 according to this Specific Example 2 can be manufactured using the display device of the present disclosure as the display unit.

Configuration that can be Employed in Present Disclosure

Note that the present disclosure can employ the following configurations.

<<A. Display Device>>

[A-1] A display device comprising:
a plurality of recess portions provided on a pixel formation surface; and
a pixel arranged in each of the plurality of recess portions,
in which a light-emitting unit of the pixel is formed on a side wall and a bottom surface of each of the plurality of recess portions.

[A-2] The display device according to [A-1] described above,
in which the pixel includes a plurality of light-emitting units with light emission colors different from each other, and
one of the plurality of light-emitting units is formed on a bottom surface of each of the plurality of recess portions.

[A-3] The display device according to [A-2] described above,
in which light emission colors of the plurality of light-emitting units include four colors of red, green, blue, and white,
red, green, and blue light-emitting units are formed on side walls of each of the plurality of recess portions, and
a white light-emitting unit is formed on the bottom surface of each of the plurality of recess portions.

[A-4] The display device according to [A-3] described above,
in which a light emission layer of a light-emitting unit formed on a side wall of a recess portion is formed by oblique evaporation of light emission material with respect to the side wall of the recess portion.

[A-5] The display device according to [A-4] described above,
in which, in oblique evaporation, an incident angle of light emission material with respect to the bottom surface of the recess portion is set to an angle at which the light emission layer is formed on the side wall and the bottom surface of the recess portion.

[A-6] The display device according to [A-5] described above,
in which the incident angle of the light emission material is set on the basis of a size of a side anode electrode formed on the side wall of the recess portion, and a size of a bottom anode electrode formed on the bottom surface of the recess portion.

[A-7] e display device according to [A-2] described above,
in which light emission colors of the plurality of light-emitting units include two colors of red, green, and blue,
light-emitting units of two colors among three colors are formed on side walls of each of the plurality of recess portions, and
a light-emitting unit of a remaining one color is formed on the bottom surface of each of the plurality of recess portions.

[A-8] The display device according to [A-7] described above,
in which a light emission layer of a light-emitting unit formed on a side wall of a recess portion is formed by oblique evaporation of light emission material with respect to the side wall of the recess portion.

[A-9] The display device according to [A-8] described above,
in which, in oblique evaporation, an incident angle of light emission material with respect to the bottom surface of the recess portion is set to an angle at which the light emission layer is not formed on the bottom surface of the recess portion.

[A-10] The display device according to any of [A-1] to [A-9] described above,
in which the light-emitting unit of the pixel includes an organic electroluminescent element.

<<B. Manufacturing Method of Display Device>>

[B-1] A manufacturing method of a display device including
a plurality of recess portions provided on a pixel formation surface, and
a pixel arranged in each of the plurality of recess portions,
the manufacturing method comprising:
in manufacturing the display device, forming a light-emitting unit of the pixel on a side wall and a bottom surface of each of the plurality of recess portions.

[B-2] The manufacturing method of a display device according to [13-1] described above,
in which the pixel includes a plurality of light-emitting units with light emission colors different from each other, and
one of the plurality of light-emitting units is formed on a bottom surface of each of the plurality of recess portions.

[B-3] The manufacturing method of a display device according to [B-2] described above,
in which light emission colors of the plurality of light-emitting units include four colors of red, green, blue, and white,
red, green, and blue light-emitting units are formed on side walls of each of the plurality of recess portions, and
a white light-emitting unit is formed on the bottom surface of each of the plurality of recess portions.

[B-4] The manufacturing method of a display device according to [B-3] described above,
in which a light emission layer of a light-emitting unit formed on a side wall of a recess portion is formed by oblique evaporation of light emission material with respect to the side wall of the recess portion.

[B-5] The manufacturing method of a display device according to [B-4] described above,
in which, in oblique evaporation, an incident angle of light emission material with respect to the bottom surface of the recess portion is set to an angle at which the light emission layer is formed on the side wall and the bottom surface of the recess portion.

[B-6] The manufacturing method of a display device according to [B-5] described above,
in which the incident angle of the light emission material is set on the basis of a size of a side anode electrode formed on the side wall of the recess portion, and a size of a bottom anode electrode formed on the bottom surface of the recess portion.

[B-7] The manufacturing method of a display device according to [B-2] described above,
in which light emission colors of the plurality of light-emitting units include two colors of red, green, and blue,
light-emitting units of two colors among three colors are formed on side walls of each of the plurality of recess portions, and
a light-emitting unit of a remaining one color is formed on the bottom surface of each of the plurality of recess portions.

[B-8] The manufacturing method of a display device according to [B-7] described above,
in which a light emission layer of a light-emitting unit formed on a side wall of a recess portion is formed by oblique evaporation of light emission material with respect to the side wall of the recess portion.

[B-9] The manufacturing method of a display device according to [B-8] described above,
in which, in oblique evaporation, an incident angle of light emission material with respect to the bottom surface of the recess portion is set to an angle at which the light emission layer is not formed on the bottom surface of the recess portion.

[B-10] The manufacturing method of a display device according to any of [B-1] to [B-9] described above,
in which the light-emitting unit of the pixel includes an organic electroluminescent element.

<<C. Electronic Device>>

[C-1] An electronic device including:
a display device including
a plurality of recess portions provided on a pixel formation surface, and
a pixel arranged in each of the plurality of recess portions,
in which a light-emitting unit of the pixel is formed on a side wall and a bottom surface of each of the plurality of recess portions.

[C-2] The electronic device according to [C-1] described above,
in which the pixel includes a plurality of light-emitting units with light emission colors different from each other, and
one of the plurality of light-emitting units is formed on a bottom surface of each of the plurality of recess portions.

[C-3] The electronic device according to [C-2] described above,
in which light emission colors of the plurality of light-emitting units include four colors of red, green, blue, and white,
red, green, and blue light-emitting units are formed on side walls of each of the plurality of recess portions, and
a white light-emitting unit is formed on the bottom surface of each of the plurality of recess portions.

[C-4] The electronic device according to [C-3] described above,
in which a light emission layer of a light-emitting unit formed on a side wall of a recess portion is formed by oblique evaporation of light emission material with respect to the side wall of the recess portion.

[C-5] The electronic device according to [C-4] described above,
in which, in oblique evaporation, an incident angle of light emission material with respect to the bottom surface of the recess portion is set to an angle at which the light emission layer is formed on the side wall and the bottom surface of the recess portion.

[C-6] The electronic device according to [C-5] described above,
in which the incident angle of the light emission material is set on the basis of a size of a side anode electrode formed on the side wall of the recess portion, and a size of a bottom anode electrode formed on the bottom surface of the recess portion.

[C-7] The electronic device according to [C-2] described above,
in which light emission colors of the plurality of light-emitting units include two colors of red, green, and blue,
light-emitting units of two colors among three colors are formed on side walls of each of the plurality of recess portions, and
a light-emitting unit of a remaining one color is formed on the bottom surface of each of the plurality of recess portions.

[C-8] The electronic device according to [C-7] described above,
in which a light emission layer of a light-emitting unit formed on a side wall of a recess portion is formed by oblique evaporation of light emission material with respect to the side wall of the recess portion.

[C-9] The electronic device according to [C-8] described above,
in which, in oblique evaporation, an incident angle of light emission material with respect to the bottom surface of the recess portion is set to an angle at which the light emission layer is not formed on the bottom surface of the recess portion.

[C-10] The electronic device according to any of [C-1] to [C-9] described above,
in which the light-emitting unit of the pixel includes an organic electroluminescent element.

REFERENCE SIGNS LIST

10 Organic EL display device
20 Pixel
20s (20r, 20g, 20b, 20w) Subpixel
21 Organic EL element
22 Drive transistor
23 Writing transistor (sampling transistor)
24 Light emission control transistor
25 Holding capacitance
26 Auxiliary capacitance
30 Pixel allay portion
31 ($31_1$ to $31_m$) Scanning line
32 ($32_1$ to $32_m$) Drive line
33 ($33_1$ to $33_n$) Signal line
81 Interlayer insulating film
82 Recess portion
83r, 83g, 83b, 83w Anode electrode
84r, 84g, 84b Organic EL layer (light emission layer)
85 Cathode electrode
86 Protection film

The invention claimed is:

1. A display device comprising:
a plurality of recess portions provided on a pixel formation surface; and
pixels respectively arranged in each of the plurality of recess portions, wherein
each of the pixels includes a red sub-pixel, a green sub-pixel, a blue sub-pixel and a white sub-pixel,
a red light-emitting unit of the red sub-pixel is formed on a first side wall of a corresponding one of the plurality of recess portions,
a green light-emitting unit of the green sub-pixel is formed on a second side wall of the corresponding one of the plurality of recess portions,
a blue light-emitting unit of the blue sub-pixel is formed on a third side wall of the corresponding one of the plurality of recess portions, and
a white light-emitting unit of the white sub-pixel is formed on a bottom surface of the corresponding one of the plurality of recess portions.

2. The display device according to claim 1, wherein light emission layers of the red, green and blue light-emitting units are formed on the first, second and third side walls by oblique evaporation of light emission material with respect to the first, second and third side walls.

3. The display device according to claim 2, wherein, in the oblique evaporation, an incident angle of light emission material with respect to the bottom surface is set to an angle at which the light emission layers are formed on the first, second and third side walls and the bottom surface.

4. The display device according to claim 3, wherein the incident angle of the light emission material is set on a basis of a size of a side anode electrode formed on a corresponding side wall of the recess portion, and a size of a bottom anode electrode formed on the bottom surface of the recess portion.

5. A display device comprising:
a plurality of recess portions provided on a pixel formation surface, each of the plurality of recess portions including a bottom surface extending along a central section of the recess portion, a first side wall and a second sidewall, the first and second side walls including upper surfaces facing the central section; and
pixels respectively arranged in each of the plurality of recess portions, wherein
each of the pixels includes a first color sub-pixel, a second color sub-pixel, and a third color sub-pixel, the first color sub-pixel, the second color sub-pixel, and the third color sub-pixel respectively being of three different colors,
a first color light-emitting unit of the first color sub-pixel is formed along the first side wall,
a second color light-emitting unit of the second color sub-pixel is formed on the second side wall, and
a third color light-emitting unit of the third color sub-pixel is formed on the bottom surface.

6. The display device according to claim 5,
wherein light emission layers of the first and second color light-emitting units are formed along the first and second side walls by oblique evaporation of light emission material with respect to the first and second side walls.

7. The display device according to claim 6,
wherein, in the oblique evaporation, an incident angle of the light emission material with respect to the bottom surface is set to an angle at which the light emission layer is not formed on the bottom surface.

8. The display device according to claim 1,
wherein the red, green, blue and white light-emitting units respectively include an organic electroluminescent element.

9. An electronic device comprising the display device according to claim 1.

10. The electronic device according to claim 9, wherein light emission layers of the red, green and blue light-emitting units are formed on the first, second and third side walls by oblique evaporation of light emission material with respect to the first, second and third side walls.

11. The electronic device according to claim 10, wherein, in the oblique evaporation, an incident angle of light emission material with respect to the bottom surface is set to an angle at which the light emission layers are formed on the first, second and third side walls and the bottom surface.

12. The electronic device according to claim 11, wherein the incident angle of the light emission material is set on a basis of a size of a side anode electrode formed on a corresponding side wall of the recess portion, and a size of a bottom anode electrode formed on the bottom surface of the recess portion.

13. The electronic device according to claim 9, wherein the red, green, blue and white light-emitting units respectively include of the pixel includes an organic electroluminescent element.

14. An electronic device comprising the display device according to claim 5.

15. The electronic device according to claim 14,
wherein light emission layers of the first and second color light-emitting units are formed along the first and second side walls by oblique evaporation of light emission material with respect to the first and second side walls.

16. The electronic device according to claim 15,
wherein, in the oblique evaporation, an incident angle of the light emission material with respect to the bottom surface is set to an angle at which the light emission layer is not formed on the bottom surface.

* * * * *